(12) United States Patent
Nonomura et al.

(10) Patent No.: US 7,994,623 B2
(45) Date of Patent: Aug. 9, 2011

(54) SEMICONDUCTOR DEVICE WITH OFFSET STACKED INTEGRATED CIRCUITS

(75) Inventors: Itaru Nonomura, Tokyo (JP); Kenichi Osada, Tokyo (JP); Makoto Saen, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 487 days.

(21) Appl. No.: 12/167,228

(22) Filed: Jul. 2, 2008

(65) Prior Publication Data
US 2009/0021974 A1   Jan. 22, 2009

(30) Foreign Application Priority Data
Jul. 17, 2007   (JP) ................................ 2007-185425

(51) Int. Cl.
*H01L 23/02* (2006.01)
*H01L 27/00* (2006.01)

(52) U.S. Cl. ........ 257/686; 257/690; 257/698; 257/723; 257/724; 257/E25.006; 257/E25.013; 257/E25.027; 438/74; 438/109

(58) Field of Classification Search .................. 257/686, 257/690, 698, 723, 724, E25.006, E25.013, 257/E25.027; 438/74, 109
See application file for complete search history.

(56) References Cited

U.S. PATENT DOCUMENTS
5,629,838 A   5/1997   Knight et al.
2007/0274198 A1   11/2007   Kuroda et al.

FOREIGN PATENT DOCUMENTS
JP   2004-253816 A   9/2004
JP   2006-066454 A   3/2006

*Primary Examiner* — Thanh V Pham
(74) *Attorney, Agent, or Firm* — Miles & Stockbridge P.C.

(57) ABSTRACT

A semiconductor device where multiple chips of identical design can be stacked, and the spacer and interposer eliminated, to improve three-dimensional coupling information transmission capability. A first semiconductor circuit including a three-dimensional coupling circuit (three-dimensional coupling transmission terminal group and three-dimensional coupling receiver terminal group); and a second semiconductor integrated circuit including a three-dimensional coupling circuit and feed-through electrode (power supply via hole and ground via hole); and a third semiconductor integrated circuit including a three-dimensional coupling circuit and feed-through electrode are stacked on the package substrate.

9 Claims, 28 Drawing Sheets

SEMICONDUCTOR DEVICE WITH OFFSET STACKED INTEGRATED CIRCUITS

CLAIM OF PRIORITY

The present application claims priority from Japanese patent application JP 2007-185425 filed on Jul. 17, 2007, the content of which is hereby incorporated by reference into this application.

FIELD OF THE INVENTION

The present invention relates to a semiconductor device, and relates in particular to technology effective for use with SiP (System in Package) made up of stacked semiconductor integrated circuits and semiconductor integrated circuits used in microprocessors, etc.

BACKGROUND OF THE INVENTION

The technology studied by the inventors may include the following technology for semiconductors.

Along with the increasing device miniaturization achieved by semiconductor manufacturing technology, the problem of inadequate I/O capability on semiconductor chips is becoming more and more serious.

This problem of inadequate I/O capability is due to an increasing number of circuits as the semiconductor chips become smaller. Moreover as the operation of each circuit speeds up, the I/O processing load needed to implement semiconductor chip functions becomes larger. The number of terminals on a semiconductor chip however is basically determined by the chip size due to restrictions such as wire bonding. The number of terminals does not increase when chips are made smaller so there is no improvement in I/O processing capability.

To resolve the problem of inadequate I/O capability on semiconductor chips, three-dimensional coupling techniques were intensively developed for forming terminals in two-dimensional shapes on the upper surface and lower surface of the semiconductor chip and then stacking the semiconductor chips in multiple layers to transmit information between the stacked chips.

Three-dimensional coupling techniques can be broadly grouped into a contact method that makes the semiconductor chips physically contact each other by way of via holes (or through holes); and a non-contact method that carries out non-contact communication by utilizing coils and capacitors.

The non-contact method includes an inductive coupling method utilizing stacked semiconductor chips formed as coils that cause an electrical current to flow in the coil mounted in the semiconductor chip for transmitting information, to induce a magnetic field, and transmit information by measuring the inductive current occurring in the coil mounted in the semiconductor chip that receives the information. The non-contact method also includes a capacitive coupling method where a capacitor is formed between the semiconductor chip for receiving information and the semiconductor chip for transmitting information, and information is transmitted by charging/discharging the capacitor from the semiconductor chip on the side transmitting the information, and detecting the charge on the capacitor at the semiconductor chip on the side receiving the information.

JP-A No. 2006-066454 discloses an example of technology for transmitting data between chips by utilizing inductive type three-dimension coupling technology. Also, JP-A No. 2004-253186 discloses an example of technology for transmitting data between chips by utilizing capacitive type three-dimensional coupling technology.

SUMMARY OF THE INVENTION

However a study of the above semiconductor devices of the related art by the present inventors revealed the following problems.

Supplying electrical power to the semiconductor chips for example is impossible when using either of the inductive or capacitive type coupling methods. Moreover, communication between the semiconductor chip and a device outside the package containing that chip requires making a physical connection.

Therefore, when forming a SiP from multiple stacked semiconductor chips containing non-contact type three-dimensional couplings, the coil or capacitor for the three dimensional coupling, as well as a physical connection to the power supply and ground, and for communicating outside the package, must all be present within the package.

Also, when forming a SiP from multiple stacked semiconductor chips with the same function, developing and manufacturing multiple types of chips to match the stacked positions is not desirable. Instead, stacking semiconductor chips manufactured with the same design information is preferable in terms of development costs.

In integrated circuits of the related art containing three-dimensional coupling circuits that utilize inductive coupling or capacitive coupling, the electrical power was supplied to the applicable integrated circuit by way of wire bonding or micro-bumps or via holes (through holes).

If a so-called "pyramid" SiP where the surface area of the integrated circuit installed in the lower position is large, and the surface area of the integrated circuit installed in the upper position is small, then bonding wire also connects to the integrated circuit installed at the intermediate (mid) position. However, in the so-called "inverted pyramid" SiP or the case where the chip sizes are the same or the upper chip surface area is larger than the lower chip, then when connecting to the integrated circuit at the intermediate position by bonding wire, then spacers must be inserted between both chips and a space provided between the upper and lower chips.

When using micro-bumps then an interposer must be inserted between the chips, and a separate integrated circuit and external terminal must be connected to the micro-bump formed on the integrated circuit.

When stacking identically designed chips containing via holes, the chips are stacked on each other with no offset in order to make contact with the via holes on adjacent chips.

Insertion of spacers and interposers should be avoided in three-dimensional couplings in order to keep the transmission distance as short as possible. Mounting multiple transmission coils along the same axis when using inductive type three-dimensional coupling disrupts communications so countermeasures such as transmission time-sharing were required to restore communications via three-dimensional coupling where chips of identical design were stacked with no offsets.

In view of the above problems with the related art, the present invention has the object of providing technology for semiconductor devices that allows stacking multiple chips of the same design and also improving the information transmission capability of the three-dimensional coupling while eliminating spacers and interposers.

Other objectives and unique features of this invention will become apparent from the description in these specifications and the drawings.

A brief description of typical aspects disclosed in this invention is given as follows.

Namely, the semiconductor device of this invention is a first semiconductor integrated circuit including a three-dimensional coupling circuit (three-dimensional coupling transmit terminal group and three-dimensional coupling receiver terminal group); and a second and a third semiconductor integrated circuit including a three-dimensional coupling circuit and feed-through electrode (power supply via hole and ground via hole) in a stacked configuration.

The semiconductor device of this invention is a stacked first and second and third semiconductor integrated circuits containing a three-dimensional coupling circuit and feed-through electrode.

The typical effects rendered by the invention disclosed in these specifications are briefly described as follows.

(1) The invention achieves high-speed communication by three-dimensional coupling between semiconductor integrated circuits (semiconductor chips), communication by physical wiring between the semiconductor integrated circuit and outside the package; and supply of power to the semiconductor integrated circuit.

(2) The invention reduces the costs required for developing semiconductor chips to a minimum.

DETAILED DESCRIPTION OF THE PREFERRED EMBODIMENTS

Figure 1:
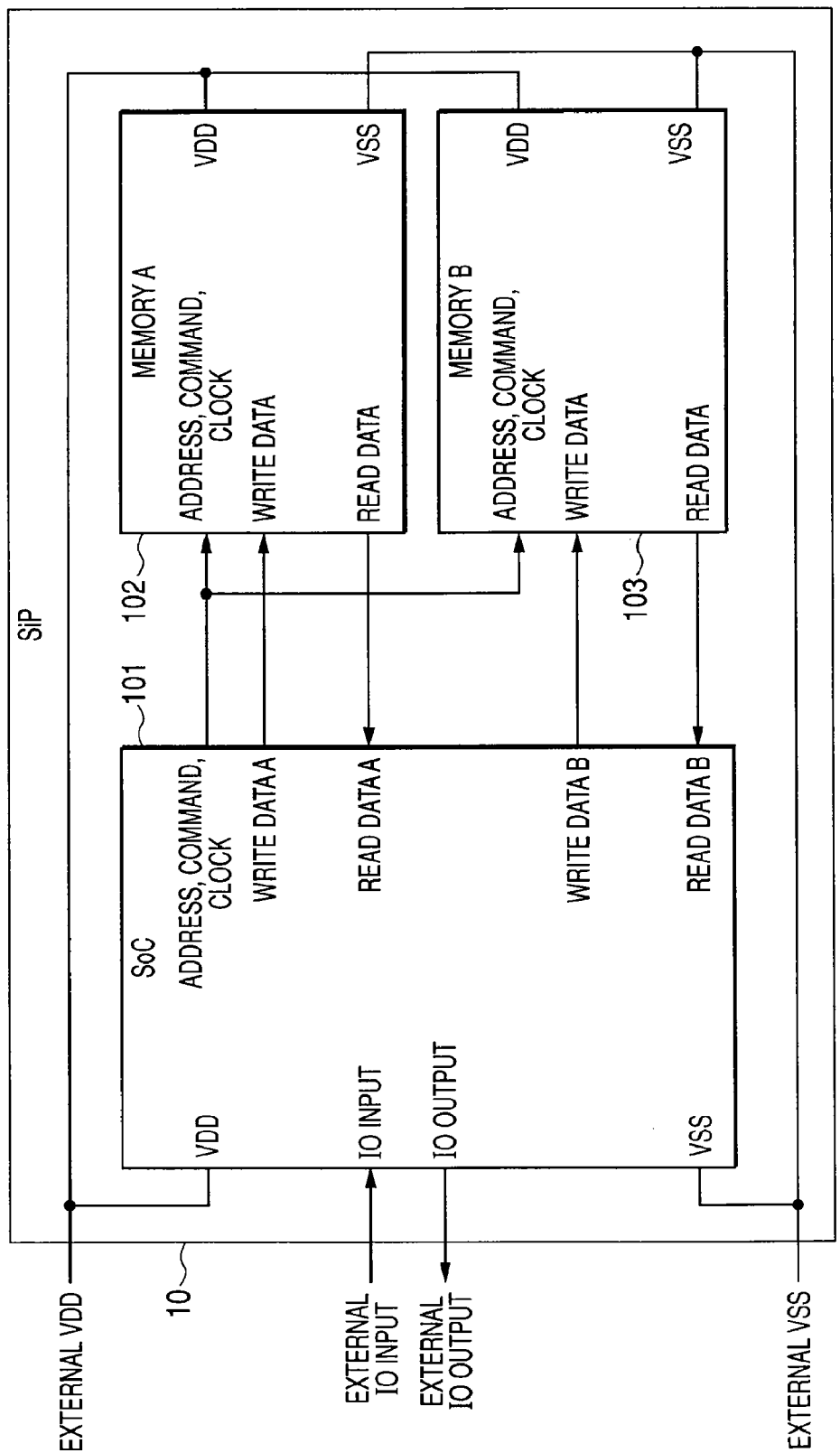
FIG. 1 is a block diagram showing the related function connections of the SiP of the first through fifth embodiments of this invention.

The embodiments of this invention are hereinafter described in detail based on the drawings. The same structural members are as a general rule assigned the same reference numerals in all drawings for the embodiments and repeated descriptions are emitted.

First Embodiment

The first embodiment of this invention is stacked semiconductor integrated circuits contained in the SiP with the terminals set upwards and connected by bonding wire.

FIG. 1 is a block diagram showing the structure of the semiconductor device of the first embodiment of this invention. FIG. 1 is a logical block diagram showing the related functional connections for the System In Package (Hereafter, called SIP.) of the first embodiment of this invention.

The SiP 10 contains a SoC101, a memory A102, and a memory B103 as well as a function for communicating outside the SiP10. The SoC101 implements the applicable communication function by loading the program stored in the memory A102 and memory B103. The SoC101 also contains a function for writing on the memory A102 and the memory B103.

The SoC101 as well as memory A102 and memory B103 are semiconductor integrated circuits made for example from single crystal silicon and including CMOS (complementary MOS transistors) or bipolar transistors formed by conventional semiconductor integrated circuit technology. The SoC101 as well as memory A102 and memory B103 are connected to power and ground during operation.

The SoC101, memory A102 and memory B103 therefore each contain a power supply terminal VDD and ground terminal VSS. The SiP10 further contains an external VDD terminal and external VSS terminal in order to connect the power supply and the ground to each of the applicable power supply terminals and applicable ground terminals. The applicable external VDD terminal connects to each VDD terminal on the SoC101, the memory A102 and the memory B103. The applicable external VSS terminal connects to each VSS terminal on the SoC101, the memory A102 and the memory B103.

In order to communicate outside the SoC101 and SiP10, the SoC101 IO input terminal connects to the external IO input terminal on the SiP10; and the IO output terminal on the SoC101 connects to the external IO output terminal on SiP10.

Moreover, in order to access the memory via the SoC101, the SoC101 address terminal, command terminal, clock terminal, write data A terminal, and read data A terminal respectively connect to the memory A102 address terminal, command terminal, clock terminal, write data terminal and read data terminal. The SoC101 address terminal, command terminal, clock terminal, write data B terminal, and read data B terminal respectively connect to the memory B103 address terminal, command terminal, clock terminal, write data terminal and read data terminal.

To make the unique features of this invention easy to understand, the physical structure of SiP in the aforementioned technology and related problems are described while referring to the drawings.

Figure 2:
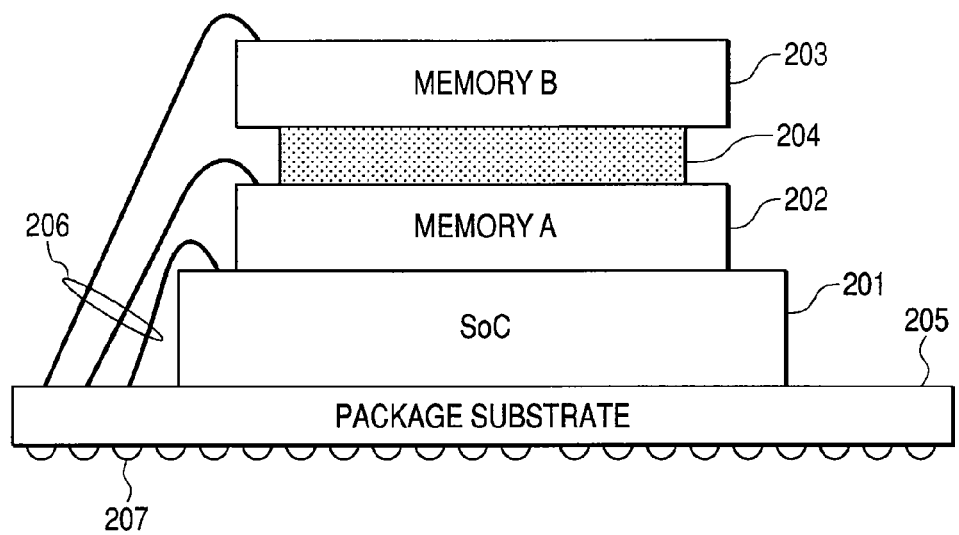
FIG. 2 is a drawing showing the internal structure of the SiP when the SoC (System-on-chip), the memory A, and the memory B are stacked using the technology of the prior art.

FIG. 2 is a drawing showing an internal view of the SiP10, where the SoC101, memory A102, memory B103 are stacked by the aforementioned techniques.

In FIG. 2, the SoC201, memory A202 and memory B203 respectively correspond to the SoC101, memory A102 and memory B103 in FIG. 1.

A spacer 204 is a member for forming a space for connecting the bonding wires to the terminal side of the memory A202.

A package substrate 205 is a member containing wiring (layers) mutually connecting to the SoC201, memory A 202, memory B203; and the SoC201, memory A202, memory B203 and the external terminal 207 described later on.

The external terminal 207 is a connection terminal for connecting the SiP10 with an external device.

A bonding wire 206 is wire for connecting the SoC201, memory A202, memory B203 and the package substrate 205.

The package substrate and chips inside the SiP are currently mostly connected by bonding wire.

Bonding wire connection techniques have already been established yet reducing the size of bonding pads formed on the chip that allow connecting bonding wires is difficult so using multiple bonding wires to connect the chips is also difficult, and this limits data transfer between chips. Moreover in order to connect the chip terminal side (surface where bonding wire is connected) by bonding wire to a chip blocked by another chip as in memory A202 in FIG. 2, a space must be formed on the upper chip by using a spacer. Reducing the thickness of the entire SiP in order to make this space is difficult.

This invention reduces power consumption and improves data transfer by switching communications between the SoC101 and memory A102 and memory B102 to a three-dimensional coupling terminated within the SiP10 and switches the power and ground connections from wire bonding to via (through) holes in order to eliminate the spacers required for three-dimensional coupling.

The physical structure of the SiP10 of this invention is described next while referring to the drawings.

Figure 3:
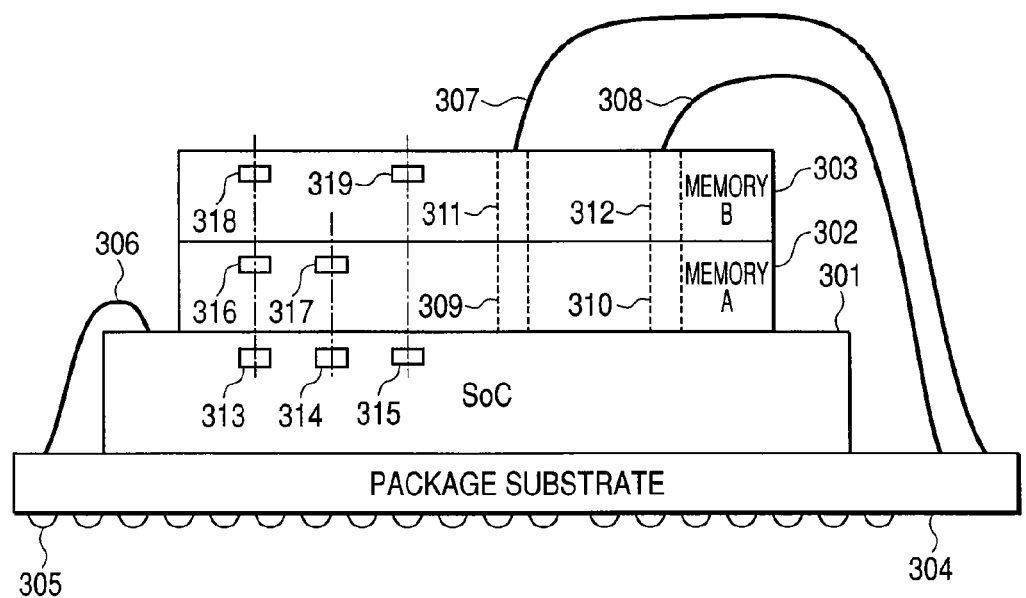
FIG. 3 is a drawing seen from a horizontal view showing the semiconductor integrated mounted in the SiP of the first embodiment of this invention.

FIG. 3 is a drawing showing a horizontal view of the semiconductor integrated circuit mounted in the SiP10 of the first embodiment of this invention.

In the SiP10 of this invention, the SoC301, and memory A302 and memory B303 are all stacked with the terminal side upward. Hereafter, in these specifications, the state where the terminal side of the integrated circuit is upwards is expressed as, "face-up", and the state where the terminal side of the integrated circuit is downwards is expressed as "face-down".

The structure of SiP10 is described first.

The SiP10 contains an SoC301, a memory A302, a memory B303, a package substrate 304, an external terminal 305, and bonding wires 306-308.

The SoC301, memory A302, memory B303 respectively correspond to the SoC101, memory A102, and memory B103 in FIG. 1.

The memory A302 contains a power supply via hole 309 and a ground via hole 310. The applicable power supply via hole and applicable ground via.

The memory B303 contains a power supply via hole 311 and a ground via hole 312. The applicable power supply via hole B303.

The package substrate 304 is a member containing the SoC301, a memory A302, a memory B303, a package substrate 304, and external terminal 305 described later on.

The external terminal 305 is a connection terminal for connecting the SiP10 to an external device.

The bonding wire 306 is a bonding wire for connecting the SoC301 and the package substrate 304. The bonding wire 306 corresponds to a wire for connecting the VDD terminal, VSS terminal, IO input terminal, IO output terminal of the SoC101, to the respective external VDD terminal, external VSS terminal, external IO input terminal and external IO output terminal in FIG. 1.

The bonding wire 307 is a bonding wire group for connecting the package substrate 304 to the power supply via hole 311 of memory B303. The bonding wire 307 corresponds to the wire between the external VDD terminal and the VDD terminal of memory B103 in FIG. 1.

The bonding wire 308 is a bonding wire for connecting the package substrate 304 to the ground via hole 312 of memory B303. The bonding wire 308 corresponds to the wire between the external VSS terminal and the VSS terminal of memory B103 in FIG. 1.

The three-dimensional coupling transmit terminal group 313 is three-dimensional coupling transmission terminals used by the SoC301 for sending address, command, clock and write data to the memory A302 and the memory B303. This terminal group 313 corresponds to the address terminal, command terminal clock terminal, write data A terminal, and write data B terminal of SoC101 in FIG. 1. The three-dimensional coupling transmit terminal group is a coil for sending data by the inductive coupling method, and implemented using the semiconductor integrated circuit wiring layer.

The three-dimensional coupling receive terminal group 314 is three-dimensional coupling receive terminals used by the SoC301 for receiving read data from the memory A302. This terminal group 314 corresponds to the read data A terminal of SoC101 in FIG. 1. The three-dimensional coupling receive terminal group 314 is a coil for receiving data by the inductive coupling method, and implemented using the semiconductor integrated circuit wiring layer.

The three-dimensional coupling receive terminal group 315 is three-dimensional coupling receive terminals used by the SoC301 for receiving read data from the memory B303. This terminal group 315 corresponds to the read data B terminal of SoC101 in FIG. 1.

Figure 4:
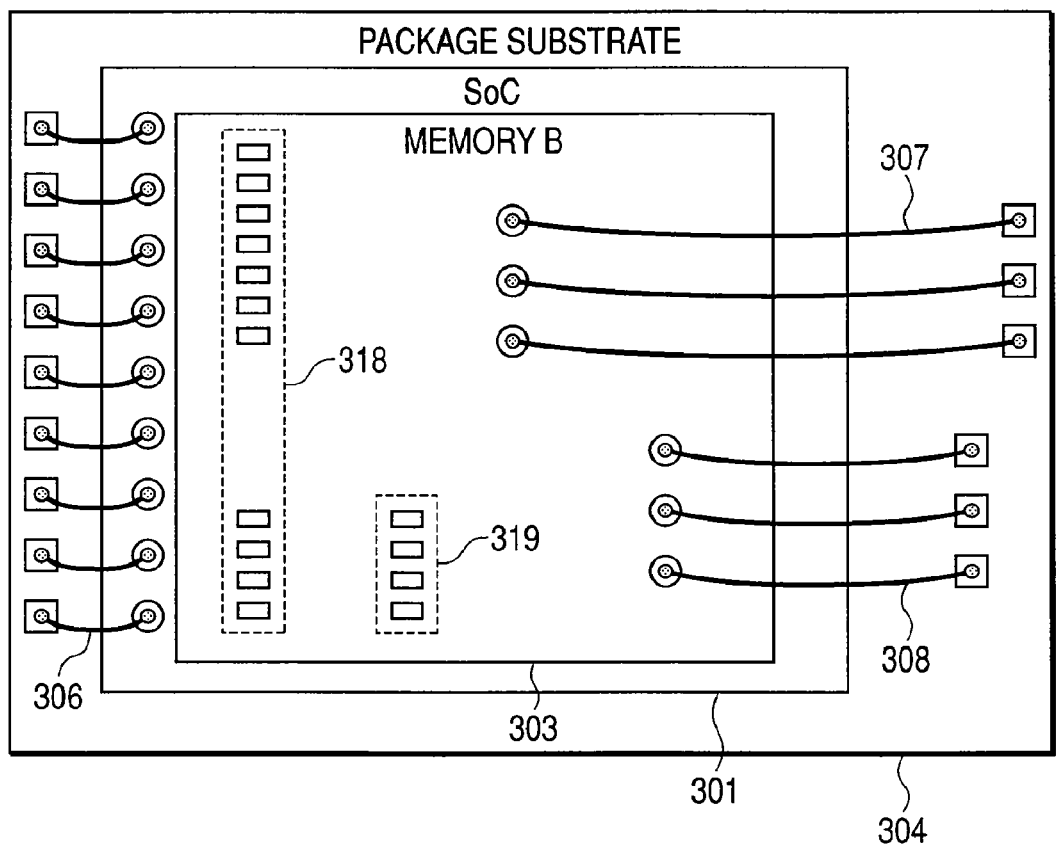
FIG. 4 is a drawing seen from a top view showing the semiconductor integrated mounted in the SiP of the first embodiment of this invention.

FIG. 4 is a top view of the semiconductor integrated circuit mounted in the SiP10 for the first embodiment of this invention.

In this SiP10 structure, the SoC301 is stacked on the package substrate 304, the memory A302 is stacked on the SoC301, and the memory B303 is stacked on the memory A302.

The memory A302 and the memory B303 are identically shaped memories. The memory B303 is mounted directly above the memory A302 and so this memory A302 does not appear in FIG. 4.

Figure 5:
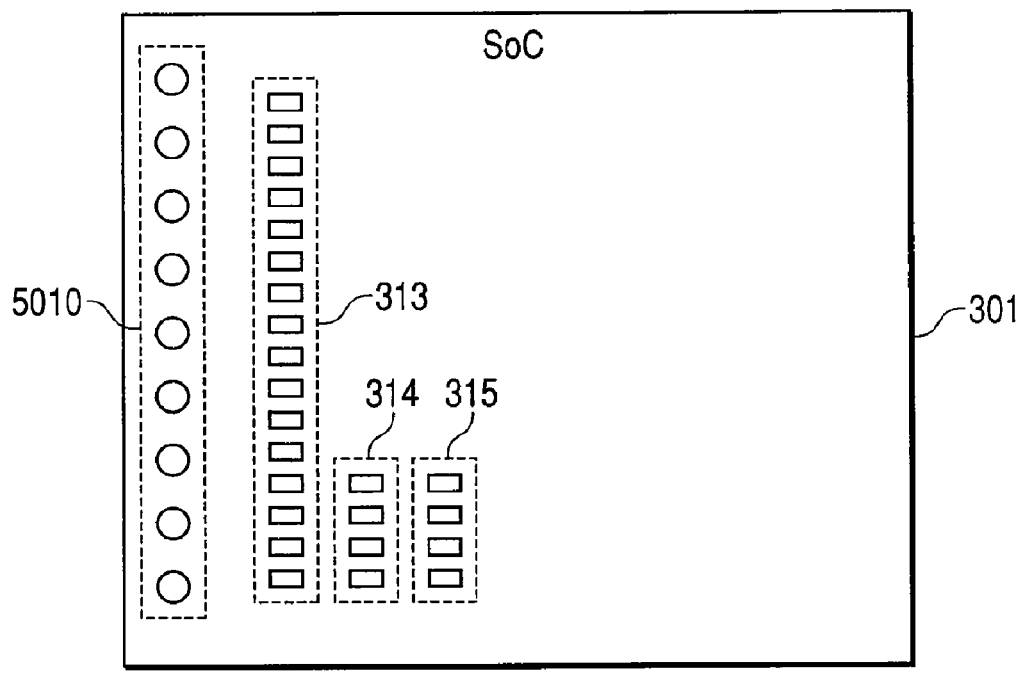
FIG. 5 is a top view of the SoC of the first embodiment of this invention.

FIG. 5 is a top view of the SoC301.

A bonding pad group 5010 and the three-dimensional coupling terminal groups 313-315 are positioned on the SoC301 terminal side. The bonding wire 306 is connected to the bonding pad group 5010.

Figure 6:
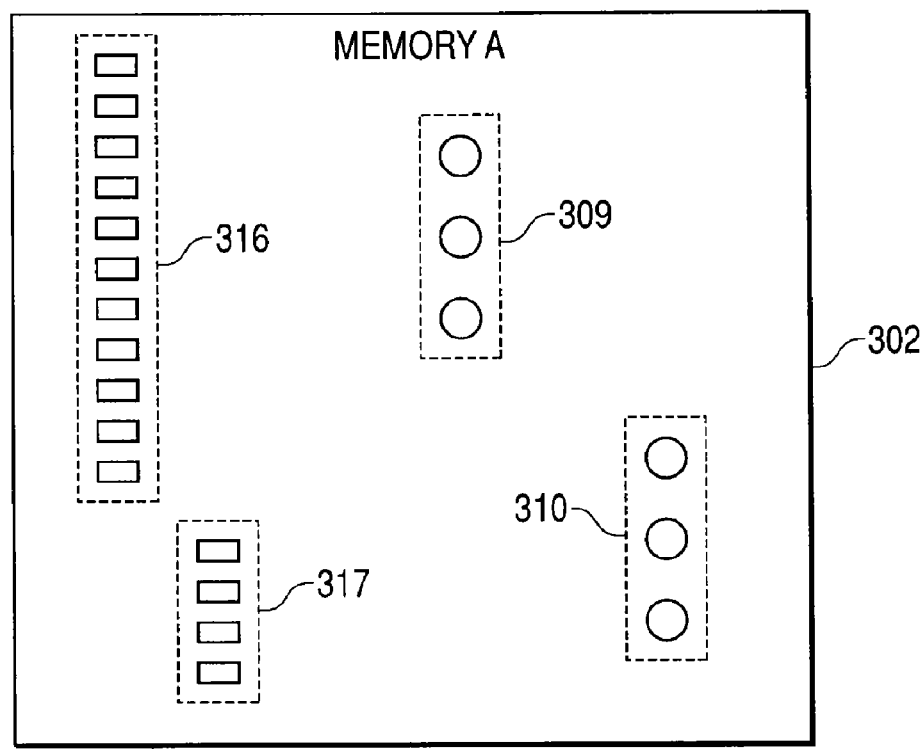
FIG. 6 is a top view of the memory A of the first embodiment of this invention.

FIG. 6 is a top view of the memory A302.

The three-dimensional coupling terminal groups 316, 317, and the power supply via hole 309 and ground via hole 310 are formed on the memory A 302 terminal side.

Figure 7:
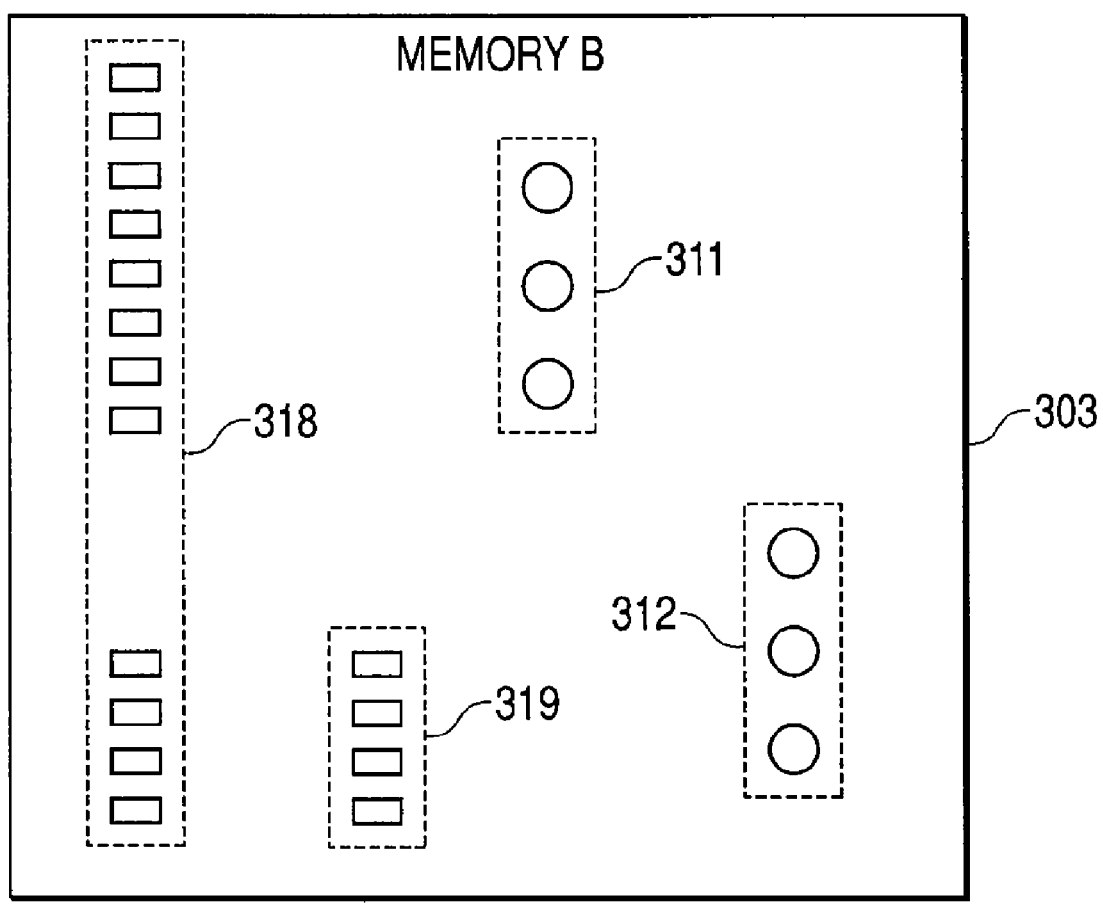
FIG. 7 is a top view of the memory B of the first embodiment of this invention.

FIG. 7 is a top view of the memory B303.

The three-dimensional coupling terminal groups 318, 319 and the power supply via hole 311 and ground via hole 312 are formed on the memory B 303 terminal side.

The relative positions of the SoC301 and memory A302 and memory B303 are described next.

First of all, the relation of the SoC301 and the memory A302 is described.

In the first embodiment, the SoC301 chip surface area is larger than the memory A302 and the memory B303, so that a bonding pad group 5010 can be formed on the SoC301 even if the memory A302 and memory B303 are directly stacked on the terminal side of SoC301. The memory A302 is therefore stacked on the terminal side of SoC301, while avoiding the bonding pad group 5010.

The three-dimensional coupling between the SoC301 and memory A302 is described here while referring to the drawing.

Figure 8:
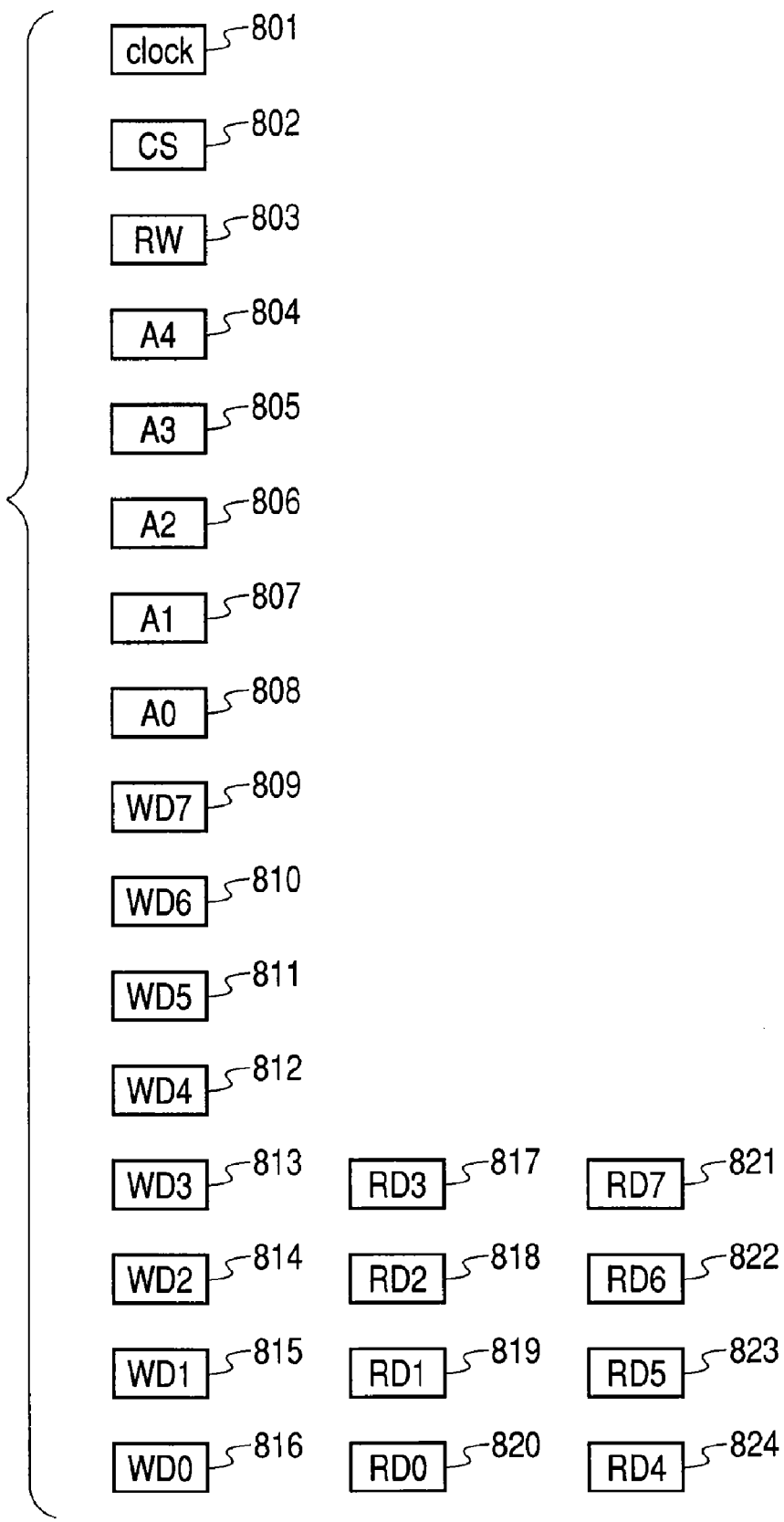
FIG. 8 is a drawing showing the terminal array of the three-dimensional coupling of the SoC (System-on-chip) of the first embodiment of this invention.

FIG. 8 is a drawing showing the terminal array of the three-dimensional coupling terminal groups 313-315 on SoC301.

The three-dimensional coupling transmit terminal group 313 includes a Clock, CS, RW, A4-A0, and WD7-WD0.

The three-dimensional coupling receive terminal group 314 includes RD3-RD0.

The three-dimensional coupling receive terminal group 315 includes RD7-RD4.

Figure 9:
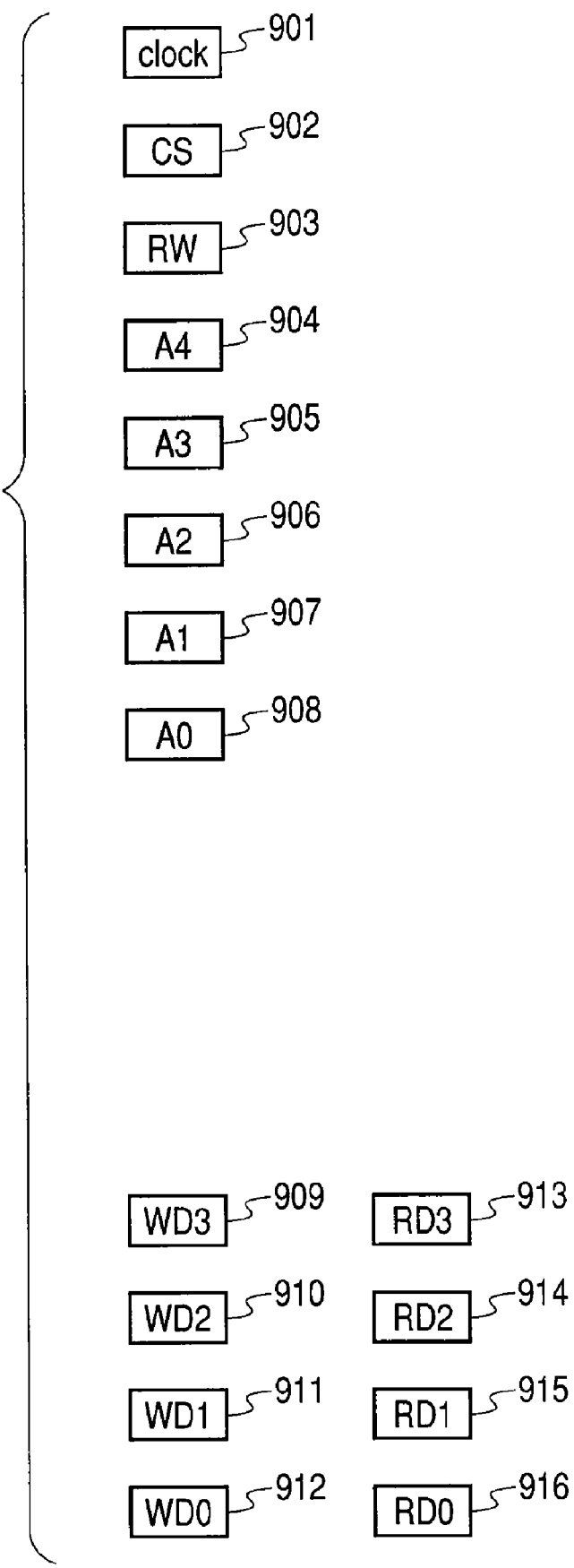
FIG. 9 is a drawing showing the terminal array of the three-dimensional coupling for the memory A of the first embodiment of this invention.

FIG. 9 is a drawing showing the terminal array for the three-dimensional coupling receive terminal group 316 and three-dimensional coupling transmit terminal group 317 on the memory A302.

The three-dimensional coupling receive terminal group 316 includes a Clock, CS, RW, A4-A0, and WD3-WD0. Communication is performed via these terminals while paired with the respective Clock, CS, RW, A4-A0, and WD3-WD0 terminals of three-dimensional coupling transmit terminal group 313.

The three-dimensional coupling transmit terminal group 317 includes RD3-RD0. Communication is performed via these terminals while paired with respective RD3-RD0 of three-dimensional coupling receive terminal group 314.

Therefore the memory A302 is stacked so that the three-dimensional coupling receive terminal group 316 is positioned directly above the three-dimensional coupling transmit terminal group 313 on the terminal side of SoC301.

The three-dimensional coupling between the memory B303 and the SoC301 is described next while referring to the drawings.

Figure 10:
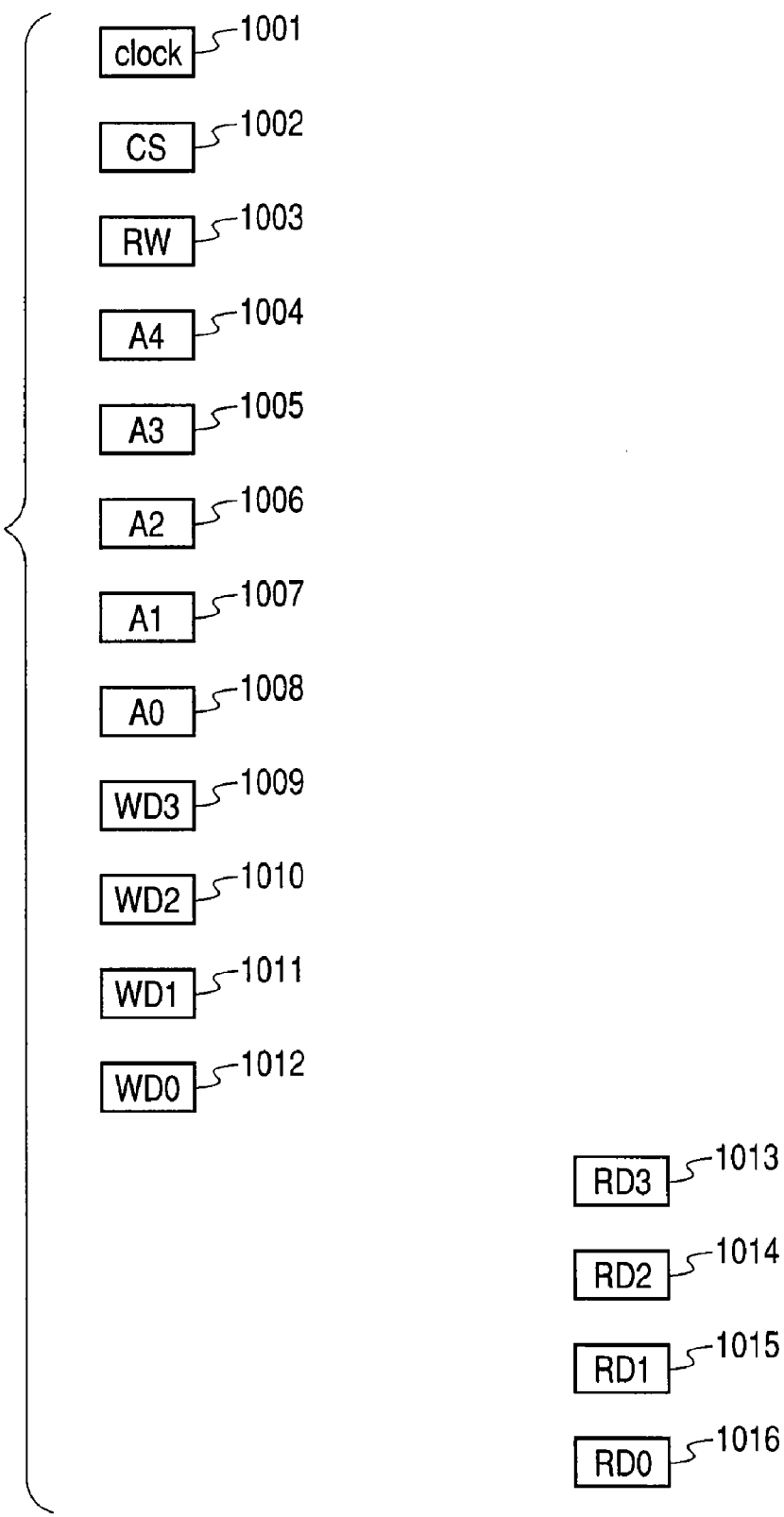
FIG. 10 is a drawing showing the terminal array of the three-dimensional coupling for the memory B of the first embodiment of this invention.

FIG. 10 is a drawing showing the terminal array for the three-dimensional terminal groups 318-319 on memory B303.

The three-dimensional coupling receive terminal group 318 includes a Clock, CS, RW, A4-A0, and WD3-WD0. Communication is performed via these terminals while paired with the respective Clock, CS, RW, A4-A0, and WD7-WD4 terminals of three-dimensional coupling transmit terminal group 313.

The three-dimensional coupling receive terminal group 319 includes the RD3-RD0. Communication is performed via these terminals while paired with respective RD7-RD4 of three-dimensional coupling receive terminal group 314.

The memory B303 is therefore stacked so that the three-dimensional coupling receive terminal group 318 is positioned directly above the three-dimensional coupling transmit terminal group 313 on the terminal side of SoC301.

The SoC301 containing the three-dimensional coupling terminals is in this way electrically coupled to the memory A302, memory B303 containing three-dimensional coupling terminals and via holes by using the bonding wire 306-308 and the package substrate 304 to make up a SiP without using spacers. The memory A302 enclosed by the SoC301 and memory B303 can therefore be connected to the power supply and ground while stacked without having to offset the memory A302 and memory B303.

Moreover, simultaneously sending (broadcasting) an address to multiple memory chips by utilizing a pair of address terminals in the SoC allows cutting the number of three-dimensional transmit coupling terminals mounted in the SoC by half compared to sending the addresses to individual memory chips between the SoC and memory without broadcasting.

The semiconductor device of the first embodiment can therefore connect the power supply and ground terminals of the semiconductor chip to the power supply and ground terminals of the package by wire bonding wire and via holes; and connect the terminals utilized for communication outside the semiconductor chip package to the power supply and ground terminals of the package by wire bonding; and by using three-dimensional coupling technology to connect the terminals used for communication between the semiconductor chips, performs high-speed communication between chips by three-dimensional coupling, performs communication between the semiconductor chips and outside the package by physical wiring, and supplies power to the semiconductor chip.

Second Embodiment

The second embodiment of this invention stacks the semiconductor integrated circuit face-down in the SiP. The physical structure of the SiP of the second embodiment is described next. The logical structure of the SiP of the second embodiment is identical to the logical structure of the SiP of the first embodiment.

Figure 11:
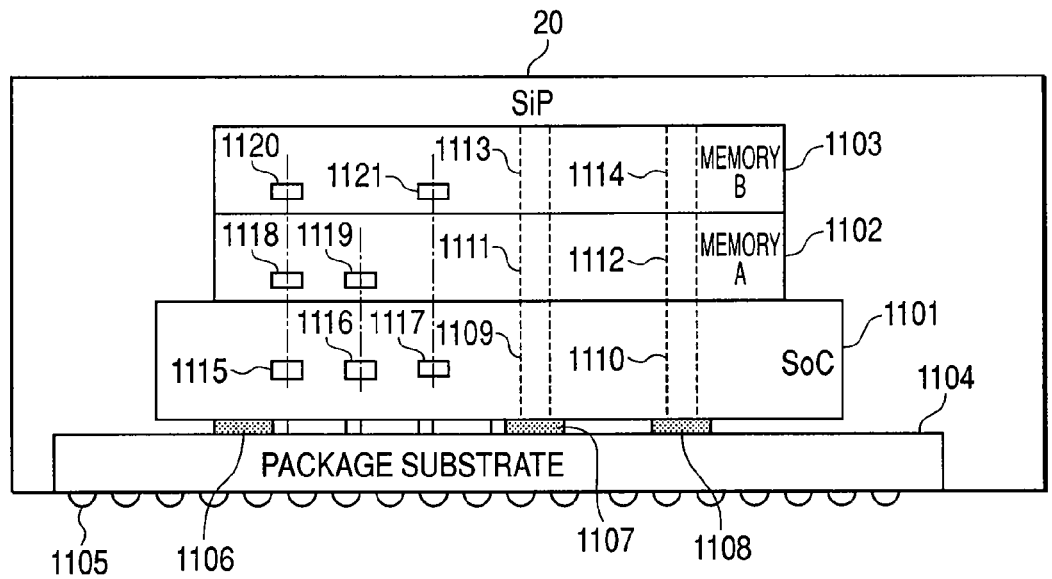
FIG. 11 is a drawing as seen from a horizontal view of the semiconductor integrated circuit mounted in the SiP of the second embodiment of this invention.

FIG. 11 is a drawing of the semiconductor integrated circuit mounted in the SiP of the second embodiment of this invention as seen from a horizontal view.

The SoC1101, the memory A1102 and the memory B1103 are all mounted face-down in the SiP20.

The structure of the SiP20 is described first.

The SiP20 contains an SoC1101, the memory A1102 and the memory B1103, the package substrate 1104, the external terminal 1105, and the micro-bumps 1106-1108.

The SoC1101, the memory A1102, and the memory B1103 correspond to the respective SoC1101, memory A102, and memory B103 in FIG. 1.

The memory A1102 of the second embodiment is identical to the memory A302 of the first embodiment.

The memory B1103 of the second embodiment is identical to the memory B303 of the first embodiment.

The package substrate 1104 is a member with internal wiring for connecting the SoC1101, memory A1102, memory B1103 with the external terminal 1105 described later on.

The external terminal 1105 is a connection terminal for connecting the SiP20 to an external device.

A micro-bump 1106 is a bump group for connecting the SoC1110 with the package substrate 1104. The micro-bump 1106 corresponds to a wire for connecting the VDD terminal, VSS terminal, IO input terminal, IO output terminal on SoC101 to the respective external VDD terminal, external VSS terminal, external IO input terminal, and external IO output terminal in FIG. 1.

A micro-bump 1107 is a bump group for connecting the power supply via hole 1109 of SoC1101 with the package substrate 1104. The micro-bump 1107 corresponds to wiring between the VDD terminal on SoC101 and the external VDD terminal as shown in FIG. 1.

A micro-bump 1108 is a bump group for connecting the ground via hole 1110 of SoC1101 and the package substrate 1104. The micro-bump 1108 corresponds to wiring between the VSS terminal on SoC101 and the external VSS terminal as shown in FIG. 1.

The three-dimensional coupling transmit terminal group 1115 and the three-dimensional coupling receive terminal groups 1116-1117 respectively correspond to the three-dimensional coupling transmit terminal group 313 and the three-dimensional coupling receive terminal groups 314-315 of the first embodiment.

Figure 12:
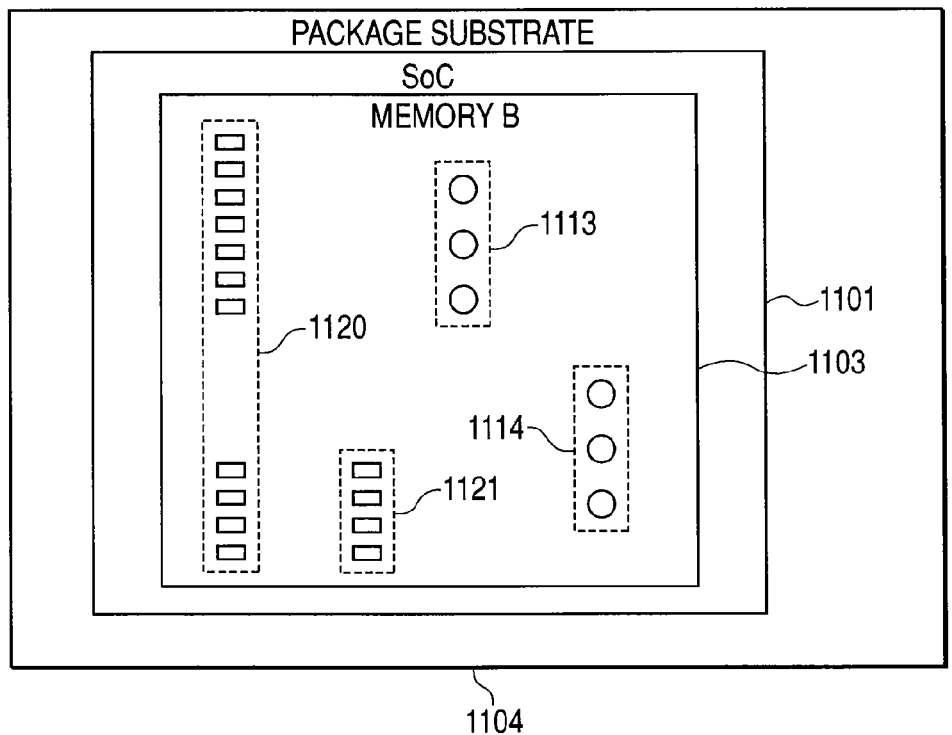
FIG. 12 is a drawing as seen from a top view of the semiconductor integrated circuit mounted in the SiP of the second embodiment of this invention.

FIG. 12 is a drawing showing a top view of the semiconductor integrated circuit mounted in the SiP20.

The SiP20 of the second embodiment employs a structure where the SoC1101 is stacked on the package substrate 1104, the memory A1102 is stacked on the SoC1101, and the memory B1103 is stacked on the memory A1102.

The memory A1102 and the memory B1103 are identically shaped memories. The memory B1103 is mounted directly above the memory A1102 so that the memory A1102 does not appear in FIG. 12.

Figure 13:
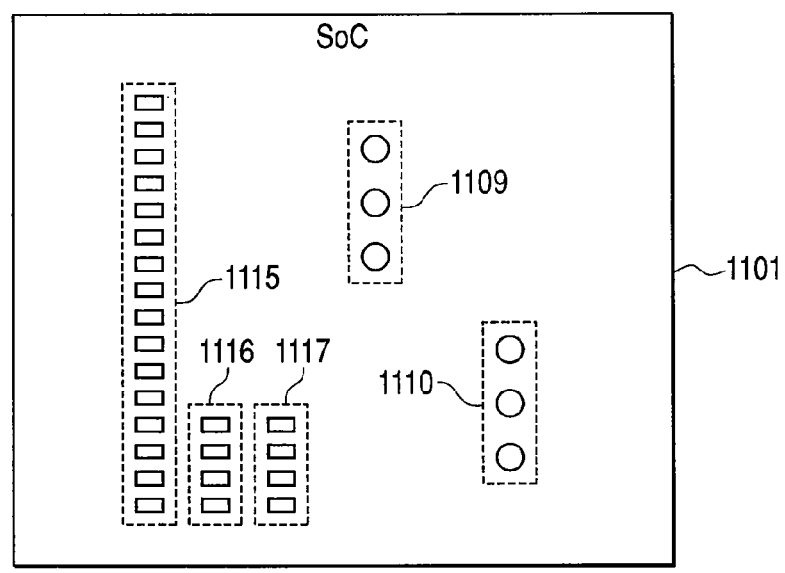
FIG. 13 is a top view of the SoC of the second embodiment of this invention.

FIG. 13 is a top view of the SoC1101.

The three-dimensional coupling transmit terminal group 1115 and the three-dimensional coupling receive terminal groups 1116-1117 and the power supply via holes 1109 and ground via holes 1110 are formed on the upper side of the SoC1101.

The SoC1101 of the second embodiment includes the power supply via holes 1109 and ground via holes 1110. The applicable via hole is exposed on both sides of the SoC1101, and connects respectively to the internal power supply mesh and ground mesh of SpC1101.

As described above, a SiP can be formed without using spacers, by utilizing a micro-bump 1106 and micro-bumps 1107-1108 to electrically couple an SoC1110 containing three-dimensional coupling terminals, with a memory A1102, and memory B1103 containing three-dimensional coupling terminals and via holes.

The memory A1102 enclosed between the SoC1110 and the memory B1103, can also be stacked with no offset versus memory B1103.

The semiconductor device of the second embodiment can therefore connect the power supply and ground terminals of the semiconductor chip to the power supply and ground terminals of the package by bumps and via holes; and connect terminals utilized for communication outside the semiconductor chip package with the power supply and ground terminals of the package by bumps; and by using three-dimensional coupling technology to connect the terminals used for communication between the semiconductor chips, performs high-speed communication between chips by three-dimensional coupling, performs communication between the semiconductor chips and outside the package by physical wiring, and supplies power to the semiconductor chip.

Third Embodiment

In the first and second embodiments, three-dimensional communication was directly performed between the SoC and memory A, and also between the SoC and memory B. However the inductive coupling coefficient is inversely proportional to the square of the distance between the coils so three-dimensional coupling to couple the memory B to the SoC requires installing a large coil because of the long distance between the chips. This large coil reduces the number of installable coils, and does not allow raising the data transfer rate.

The third embodiment described next is a method for communicating with a small coil by utilizing a chip with a signal relay function positioned in the intermediate layer.

The SiP function of the third embodiment is identical to that of the first embodiment.

Figure 14:
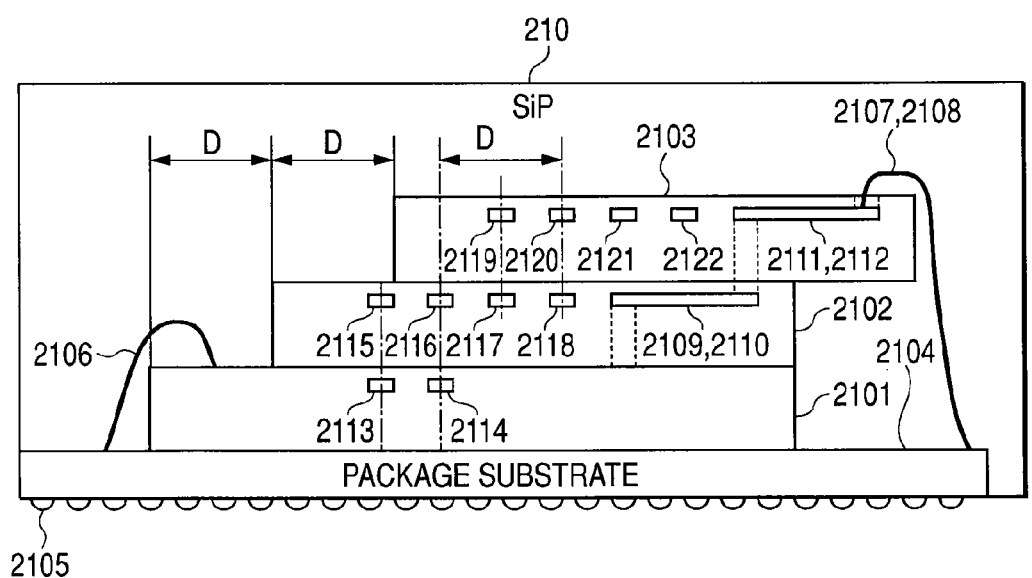
FIG. 14 is a drawing showing a horizontal view of the semiconductor integrated circuit mounted in the third embodiment of this invention.

FIG. 14 is a drawing showing a horizontal view of the semiconductor integrated circuit mounted on the SiP210 in the third embodiment of this invention.

The SoC2101, the memory A2102, and the memory B2103 are all mounted face-up in the Sip210.

The structure of the SiP210 is described next.

The SiP210 includes the SoC2101, memory A2102, memory B2103, package substrate 2104, external terminal 2105, and bonding wires 2106-2108.

In the first embodiment the memory B303 was stacked directly above the memory A302. However in the third embodiment, the memory B2103 is offset (shifted) to the right versus the memory A2102, and the memory A2102 is also offset (shifted) to the right versus the SoC2101. The amount of offset of memory B2103 versus memory A2102 is equivalent to the amount of offset of memory A2102 versus the SoC2102. In the third embodiment that offset amount is hereafter expressed as D.

The SoC2101, memory A2102, and memory B2103 respectively correspond to SoC101, memory A102, and memory B103 of FIG. 1.

The memory A2102 contains a power supply via hole 2109 and ground via hole 2110. The applicable power supply via hole 2109 and applicable ground via hole 2110 are exposed on both surfaces of the memory A2102.

In these specifications, the exposed portion of power supply via hole 2109 is hereafter called the power supply terminal for memory A2102. The exposed portion of the ground via hole 2110 is hereafter called the ground terminal for memory A2102.

The power supply via hole 2109 bends inside the memory A2102 and couples the power supply terminal on the upper side of memory A2102, with the power supply terminal on the lower side offset to the left just by a amount D from the applicable power supply terminal. The ground via hole 2110 in the same way, bends inside the memory A2102 and couples the ground terminal on the upper side of memory A2102 with the ground terminal on the lower side offset to the left just by an amount D from the applicable ground terminal.

The memory B2103 contains a power supply via hole 2111 and a ground via hole 2112. The applicable power supply via hole 2111 and a ground via hole 2112 are exposed on both surfaces of the memory B2103.

In these specifications, the exposed portion of power supply via hole 2111 is called the power supply terminal for memory B2103; and the exposed portion of the ground via hole 2112 is called the ground terminal for memory B2103.

The power supply via hole 2111 bends inside the memory B2103, and couples the power supply terminal on the upper side of memory B2103 to the power supply terminal on the lower side offset to the left just by amount D from the applicable power supply terminal. The ground via hole 2112 in the same way, bends inside the memory B2103, and couples the ground terminal on the upper side of memory B2103, to the ground terminal on the lower side offset to the left just by a amount D from the applicable ground terminal.

The package substrate 2104 is a member with internal wiring for connecting the SoC2101, memory A2102, memory B2103, and the external terminal 2105 described later on.

The external terminal 2105 is a connection terminal for connecting the SiP210 with an external device.

The bonding wire 2106 is a bonding wire group for connecting the package substrate 2104 with the SoC2101. The bonding wire 2106 corresponds to a wire for connecting the VDD terminal, VSS terminal, IO input terminal and IO output terminal of SoC101, to the respective external VDD terminal, external VSS terminal, external IO input terminal, and external IO output terminal in FIG. 1.

The bonding wire 2107 is a bonding wire group for connecting the power supply via hole 2111 of memory B2103 with the package substrate 2104. The bonding wire 2107 corresponds to the wiring between the external VDD terminal and VDD terminal of memory B103.

The bonding wire 2108 is a bonding wire group for connecting the package substrate 2104 to the ground via hole 2112 of the memory B2103. The bonding wire 2108 corresponds to the wiring between the external VSS terminal and the VSS terminal of memory B103 in FIG. 1.

The three-dimensional coupling transmit terminal group 2113 is a three-dimensional coupling transmit terminal group for transmitting address, command, and write data from the SoC2101 to the memory A2102. The three-dimensional coupling transmit terminal group 2113 corresponds to the address terminal, command terminal, write data A terminal, and write data B terminal of SoC2101 in FIG. 1.

The three-dimensional coupling receive terminal group 2114 is a three-dimensional coupling receive terminal group for the SoC2101 to receive read data sent from the memory A2102. In the third embodiment, the memory A2102 relays the read data output from the memory B2103 and therefore corresponds to the read data A terminal and the read data B terminal of SoC2101 in FIG. 1.

Figure 15:
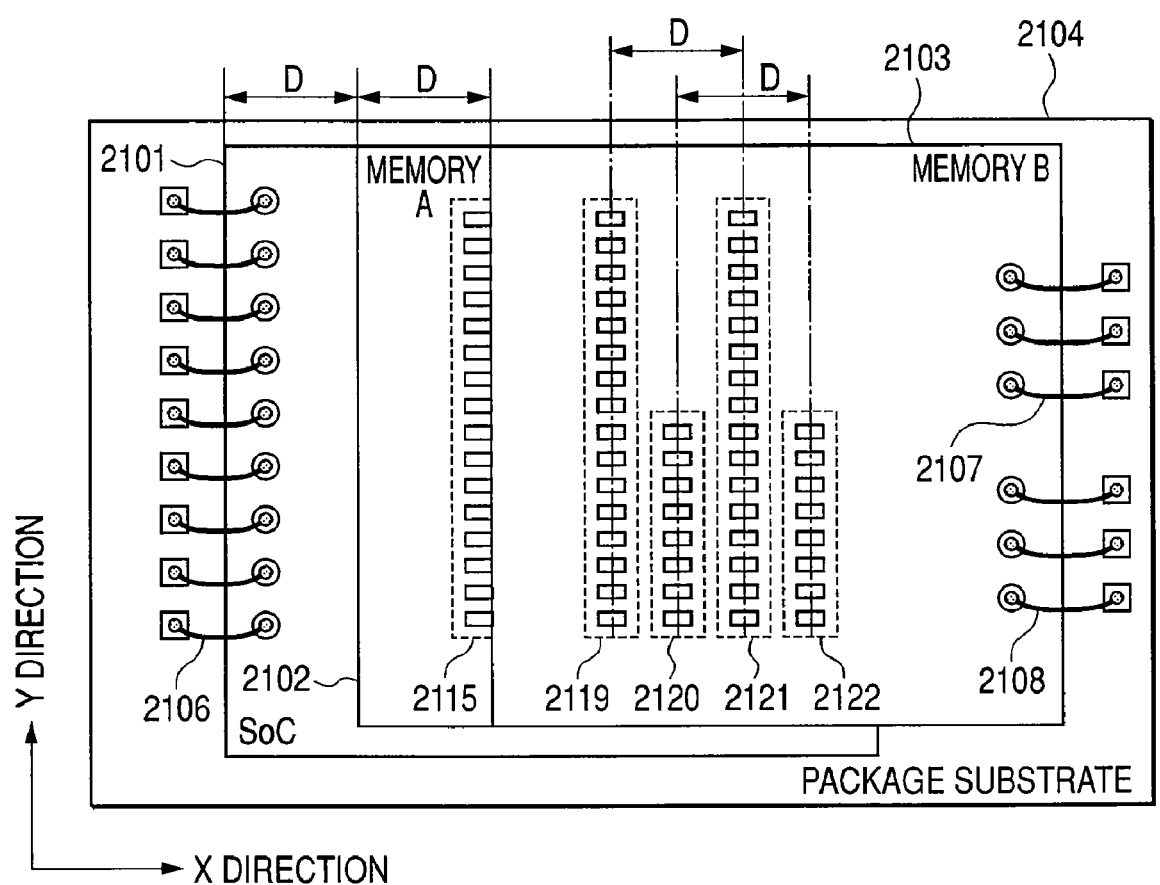
FIG. 15 is a drawing showing a top view of the semiconductor integrated circuit mounted in the third embodiment of this invention.

FIG. 15 is a top view showing the semiconductor integrated circuit mounted in the SiP210.

The SiP210 employs a structure where the SoC2101 is stacked on the package substrate 2104, the memory A2102 is stacked on the SoC2101, and the memory B2103 is stacked on the memory A2102.

Figure 16:
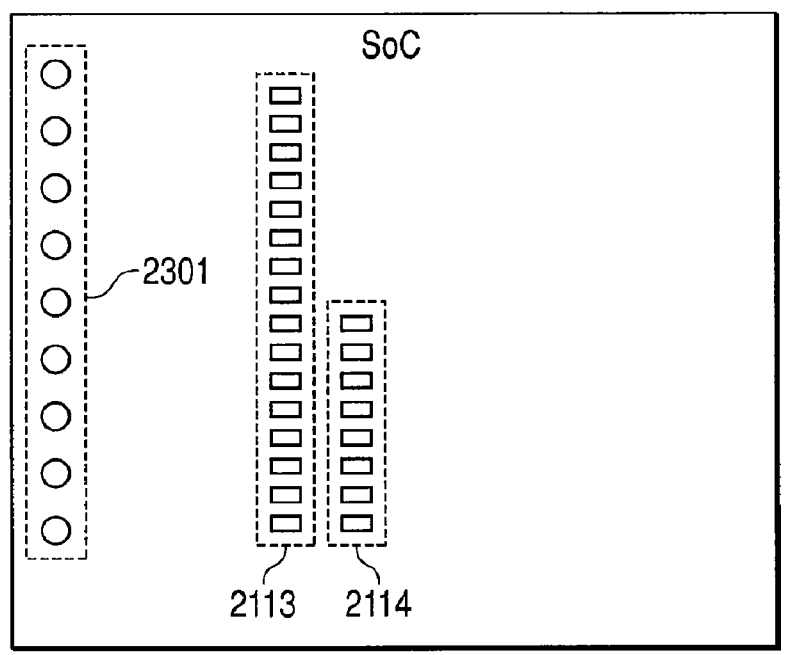
FIG. 16 is a top view of the SoC of the third embodiment of this invention.

FIG. 16 is a top view of the SpC2101.

The three-dimensional coupling terminal groups 2113-2114 and bonding wire group 2301 are formed on the upper surface of the SoC2101. A bonding wire 2106 connects to the bonding pad group 2301.

Figure 17:
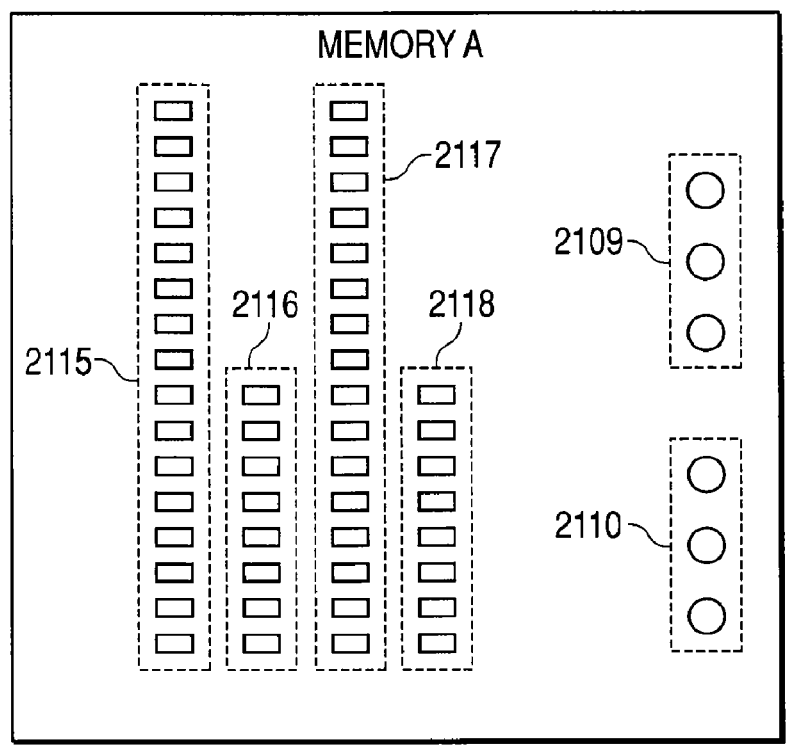
FIG. 17 is a top view of the memory A of the third embodiment of this invention.

FIG. 17 is a top view of the memory A2102.

The three-dimensional coupling terminal groups 2115-2118 and power supply via hole 2109 and ground via hole 2110 are formed on the terminal side of the memory A2102.

The three-dimensional coupling terminal group 2117 is formed at a position offset to the right just by an amount D from the three-dimensional coupling terminal group 2115.

The three-dimensional coupling terminal group 2118 is formed at a position offset to the right just by an amount D from the three-dimensional coupling terminal group 2116.

The three-dimensional coupling terminal group 2117 resends the signal received by the three-dimensional coupling terminal group 2115.

The three-dimensional coupling terminal group 2116 resends the signal received by the three-dimensional coupling terminal group 2118.

Figure 18:
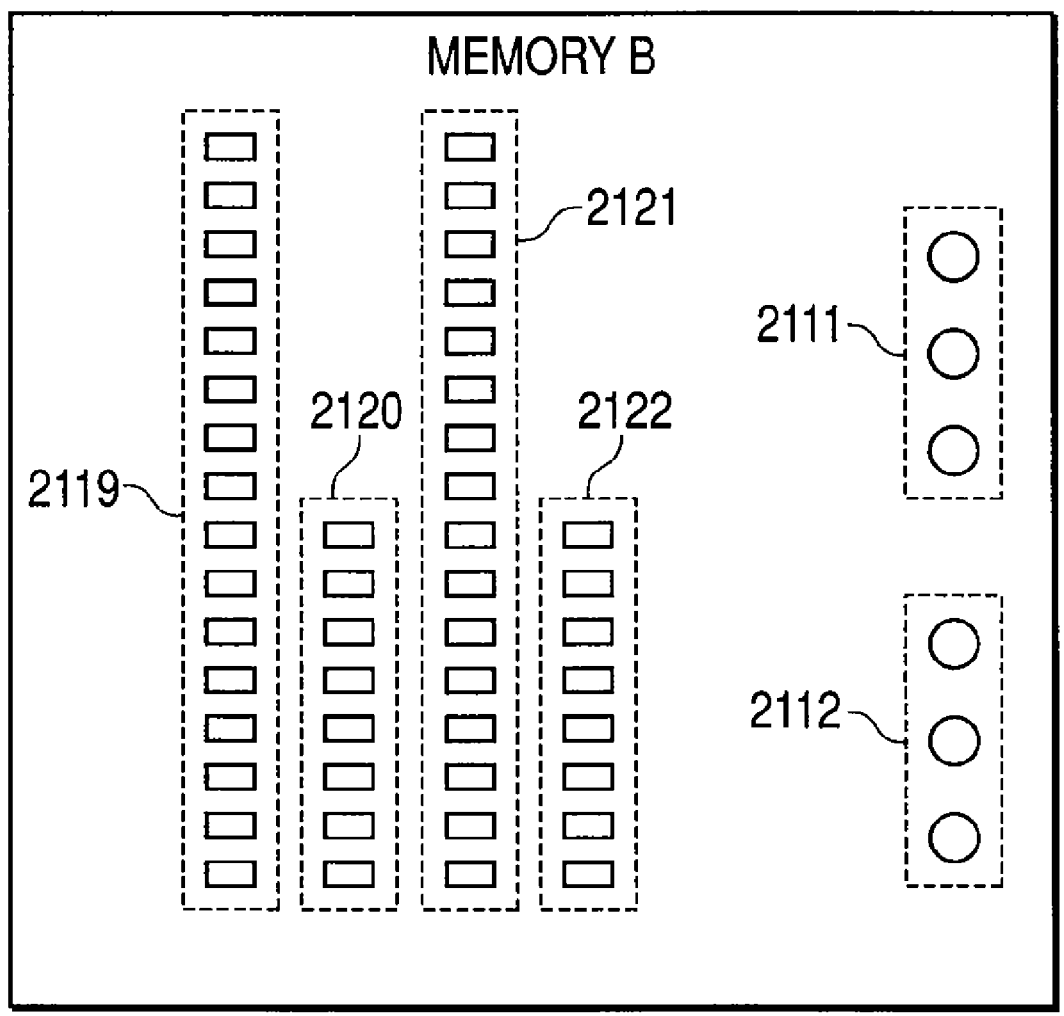
FIG. 18 is a top view of the memory B of the third embodiment of this invention.

FIG. 18 is a top view of the memory B2103.

The three-dimensional coupling terminal groups 2119-2122 and power supply via holes 2111 and the ground via holes 2112 are formed on the terminal side of the memory B2103.

The three-dimensional coupling terminal group 2121 is formed at a position offset to the right just by an amount D from the three-dimensional coupling terminal group 2119.

The three-dimensional coupling terminal group 2122 is formed at a position offset to the right just by an amount D from the three-dimensional coupling terminal group 2120.

The relative positions of the memory A2102, memory B2103 and SoC2101 are described next.

The relative positions of the SoC2101 and memory A2102 is described first.

In the third embodiment, the memory A2102 is stacked offset to the right by an amount D relative to the SoC2101, so that the bonding pad group 2301 can be installed.

The three-dimensional coupling between the SoC2101 and the memory A2102 is described here while referring to the drawing.

Figure 19:
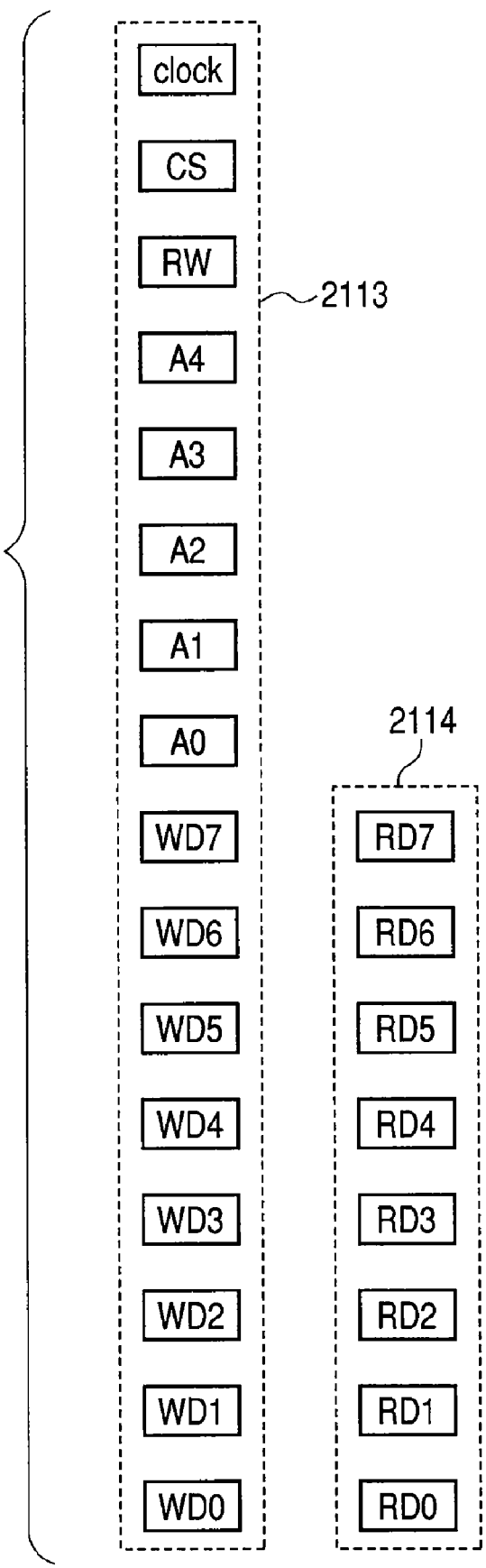
FIG. 19 is a drawing showing the terminal array for the three-dimensional coupling terminals on the SoC (System-on-chip) of the third embodiment of this invention.

FIG. 19 is a drawing showing the terminal array of the three-dimensional coupling receive terminal group 2114 and three-dimensional coupling transmit terminal group 2113 of SoC2101.

The three-dimensional coupling transmit terminal group 2113 includes a Clock, CS, RW, A4-A0, WD7-WD0. The three-dimensional coupling receive terminal group 2114 contains an RD7-RD0.

Figure 20:
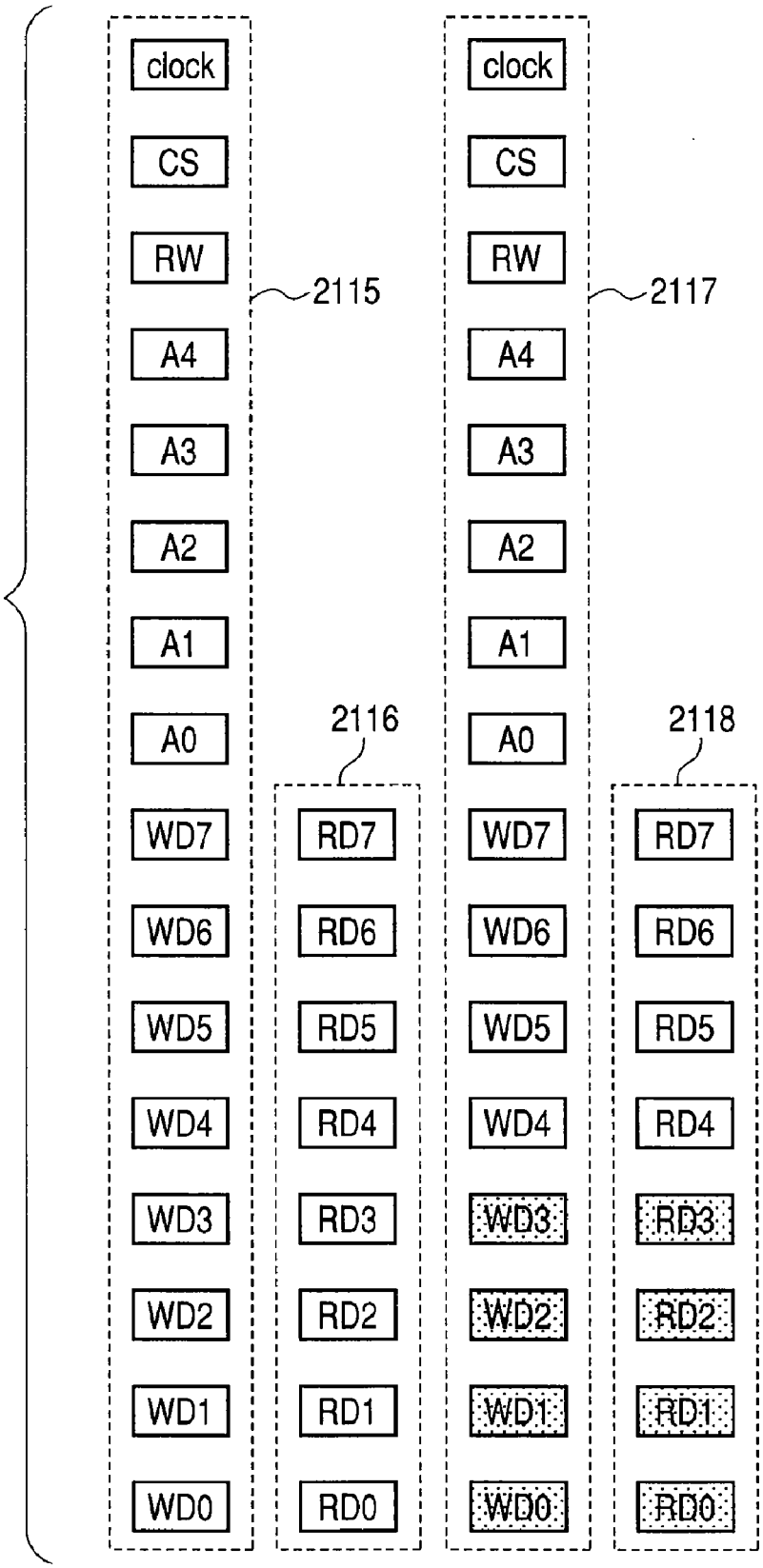
FIG. 20 is a drawing showing the terminal array for the three-dimensional coupling terminals on the Memory A of the third embodiment of this invention.

FIG. 20 is a drawing showing the terminal arrays of the three-dimensional coupling transmit terminal groups 2116, 2117 and the three-dimensional coupling receive terminal groups 2115, 2118 of memory A2102.

The three-dimensional coupling receive terminal group 2115 includes a Clock, CS, RW, A4-A0, and WD7-WD0. Communication is performed via these terminals while paired with the respective Clock, CS, RW, A4-A0, and WD7-WD0 of the three-dimensional coupling transmit terminal group 2313.

The three-dimensional coupling transmit terminal group 2116 includes RD7-RD0. These terminals communicate while paired with the respective RD7-RD0 terminals of three-dimensional coupling receive terminal group 2114.

On the memory A2102, the three-dimensional coupling receive terminal group 2115 is stacked at a position overlapping the three-dimensional coupling transmit terminal group 2113 on the terminal side of SoC2101.

The three-dimensional coupling transmit terminal group 2117 includes a Clock, CS, RW, A4-A0, WD7-WD0.

The three-dimensional coupling receive terminal group 2118 includes RD7-RD0.

The three-dimensional coupling of the memory A2102 to the memory B2103 is described next while referring to the drawing.

Figure 21:
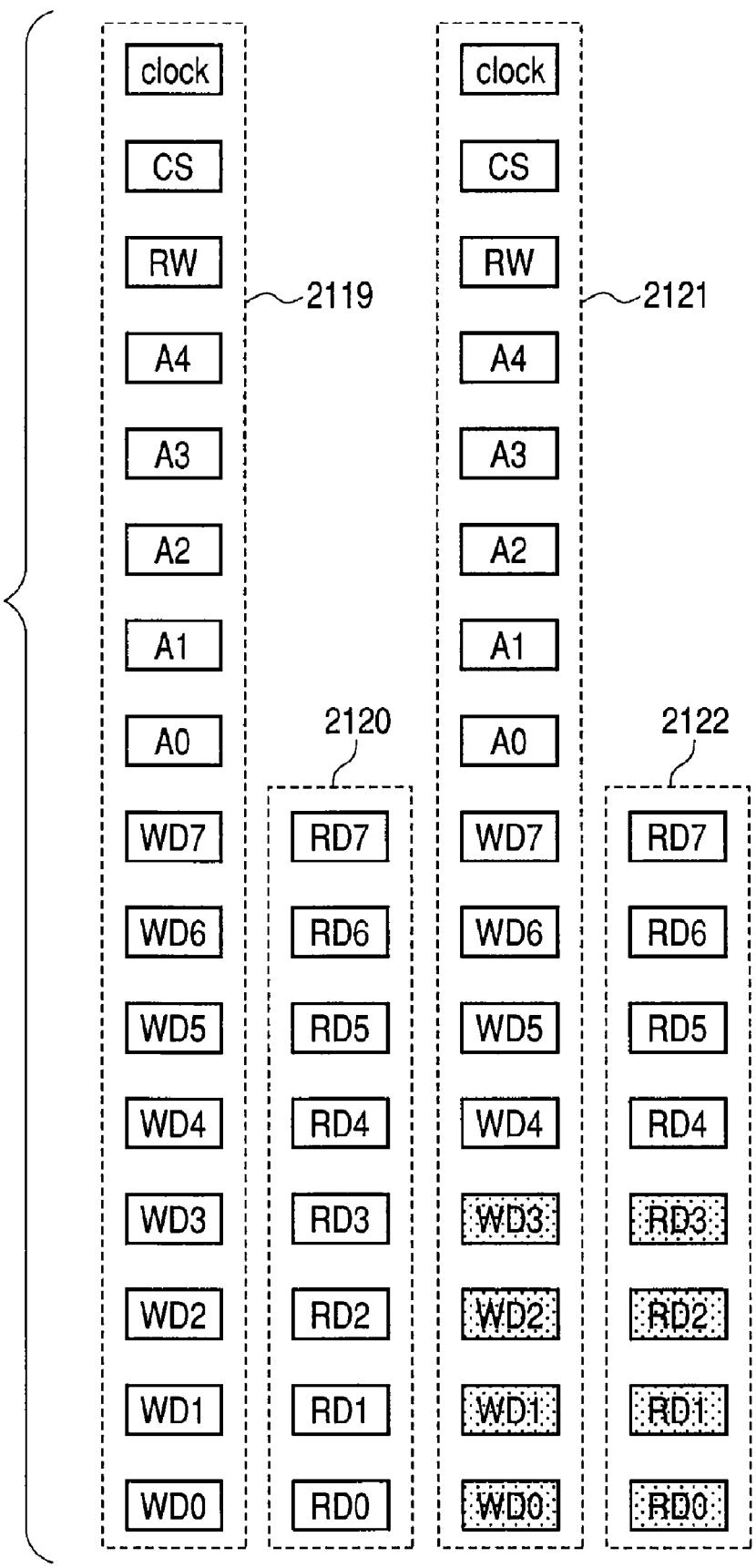
FIG. 21 is a drawing showing the terminal array for the three-dimensional coupling terminals on the Memory B of the third embodiment of this invention.

FIG. 21 is a drawing showing the terminal arrays of the three-dimensional coupling transmit terminal groups 2120, 2121 and the three-dimensional coupling receive terminal groups 2119, 2122 of memory B2103.

The three-dimensional coupling receive terminal group 2119 includes a Clock, CS, RW, A4-A0, and WD7-WD0. Communication is performed via these terminals while paired with the respective Clock, CS, RW, A4-A0, and WD7 of three-dimensional coupling transmit terminal group 2117.

The three-dimensional coupling transmit terminal group 2120 includes RD7-RD0. These terminals communicate while paired with the respective RD7-RD0 terminals of three-dimensional coupling receive terminal group 2118.

The third embodiment does not utilize the three-dimensional coupling receive terminal group 2122 and the three-dimensional coupling transmit terminal group 2121.

Therefore on the memory B2103, the three-dimensional coupling receive terminal group 2119 is stacked at a position directly above the three-dimensional coupling transmit terminal group 2117 on the memory A2102 terminal side.

A SiP can therefore be formed in this way without using spacers, by electrically coupling the SoC2101, memory A2102, memory B2103 inside the SiP210 by bonding wires 2106-2108.

Moreover, in the third embodiment, communication by three-dimensional coupling was limited entirely to adjacent chips by offset-stacking the semiconductor integrated circuits, and by installing the three-dimensional the same as this offset amount.

Small three-dimensional transmit coils and receive coils could therefore be used in the third embodiment.

Moreover, since all chips in the third embodiment are stacked with an offset, a space can be provided within the Sip for installing bonding wires and bonding pads on all chips.

The memory chip design cost can also be kept low by using an identical design for the chips in the memory A2102 and the memory B2103.

Also, by arraying the terminals or terminal groups utilized for the three-dimensional connection in the sequence of transmit-receive-receive-transmit, and by stacking them with an offset just by the width required for wire bonding, so that a minimum of semiconductor types can be used, and semiconductor chip development costs in this way held to a minimum.

Fourth Embodiment

The fourth embodiment is described using as an example, the SiP10 of the first embodiment with the memory A, memory B, and a SoC stacked in that order of nearness to the package substrate.

The physical structure of the SiP of the fourth embodiment is described next. The logical structure of the SiP of the fourth embodiment is identical to the structure of the first embodiment.

Figure 22:
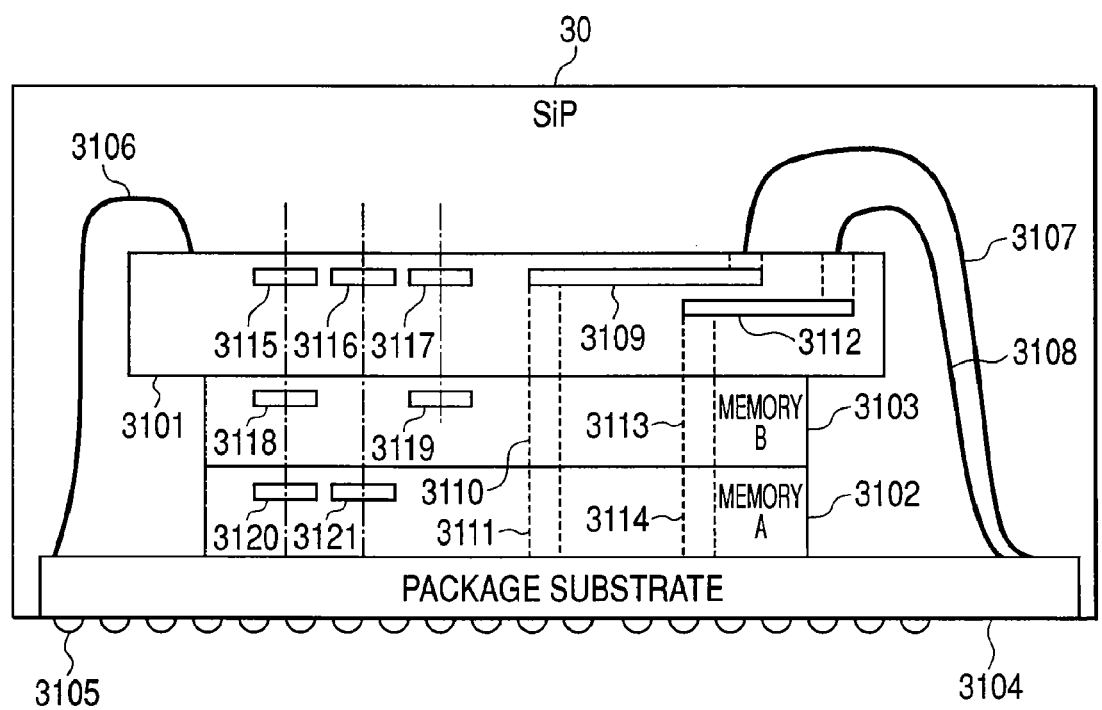
FIG. 22 is a drawing as seen from a horizontal view showing the semiconductor integrated circuit mounted in the SiP of the fourth embodiment of this invention.

FIG. 22 is a drawing showing the semiconductor integrated circuit mounted in the SiP30 as seen from a horizontal view.

The SoC3101, the memory A3102, and the memory B3103 are all stacked face-up in the SiP30.

The structure of the SiP30 is described first.

The SiP30 includes the SoC3101, memory A3102, memory B3103, package substrate 3104, external terminal 3105, and the bonding wires 3106-3108.

The SoC3101, memory A3102, and memory B3103 correspond respectively to the SoC101, memory A102, memory B103 of FIG. 1.

The memory A3102 of the fourth embodiment is identical to the memory A302 of the first embodiment.

The memory B3103 of the fourth embodiment is identical to the memory B303 of the first embodiment.

The package substrate 3104 is a member with internal wiring for connecting to the SoC3101, memory A3102, memory B3103, and the external terminal 3105 described later on.

The external terminal 3105 is a connection terminal for connecting the SiP30 with an external device.

The bonding wire 3106 is a bonding wire group for connecting the package substrate 3104 to the SoC3101. The bonding wire 3106 corresponds to wire for connecting the VDD terminal, VSS terminal, IO input terminal and IO output terminal of SoC101 in FIG. 1 to the respective external VDD terminal, external VSS terminal, external IO input terminal, and external IO output terminal of FIG. 1.

The bonding wire 3107 is a bonding wire group for connecting the package substrate 3104 with the power supply via holes 3109 of SoC3101. The bonding wire 3107 corresponds to wiring between the external VDD terminal and the VDD terminal of SoC101 in FIG. 1.

The bonding wire 3108 is a bonding wire group for connecting the package substrate 3104 with the ground via holes 3112 of SoC3101. The bonding wire 3108 corresponds to wiring between the external VSS terminal and the VSS terminal of SoC101 in FIG. 1.

The three-dimensional coupling transmit terminal group 3115 and the three-dimensional coupling receive terminal groups 3116-3117 respectively correspond to the three-dimensional coupling transmit terminal group 313 and the three-dimensional coupling receive terminal groups 314-315 of the first embodiment.

Figure 23:
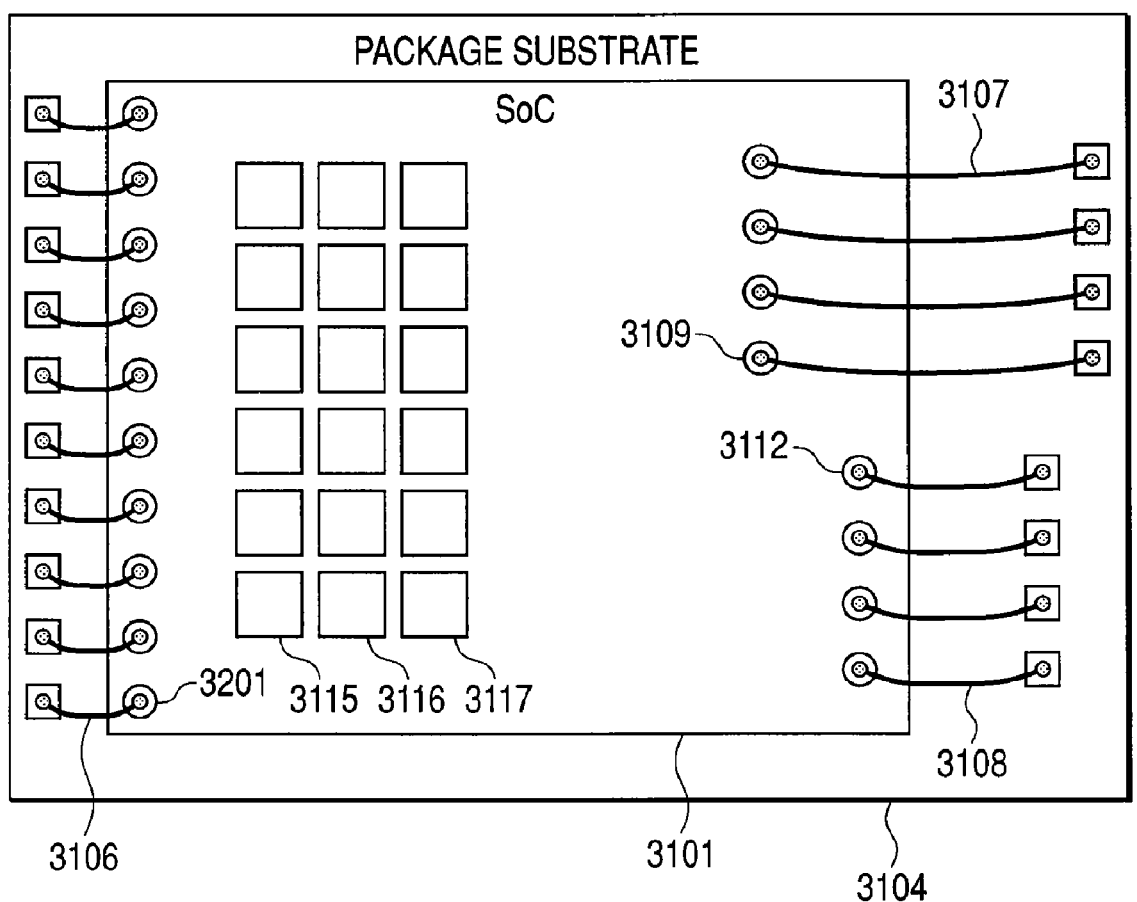
FIG. 23 is a top view of the semiconductor integrated circuits stacked in the Sip of the fourth embodiment of this invention.

FIG. 23 is a top view of the semiconductor integrated circuits stacked in the SiP30.

The SiP30 of the fourth embodiment employs a structure where the memory A3102 is stacked on the package substrate 3104, the memory B3103 is stacked on the memory A3102, and the SoC3101 is stacked on the memory B3103.

The memory A3102 and the memory B3103 are identical shaped memories. The memory B3103 is mounted directly above the memory A3102 so that the memory A3102 does not appear in FIG. 23.

Figure 24:
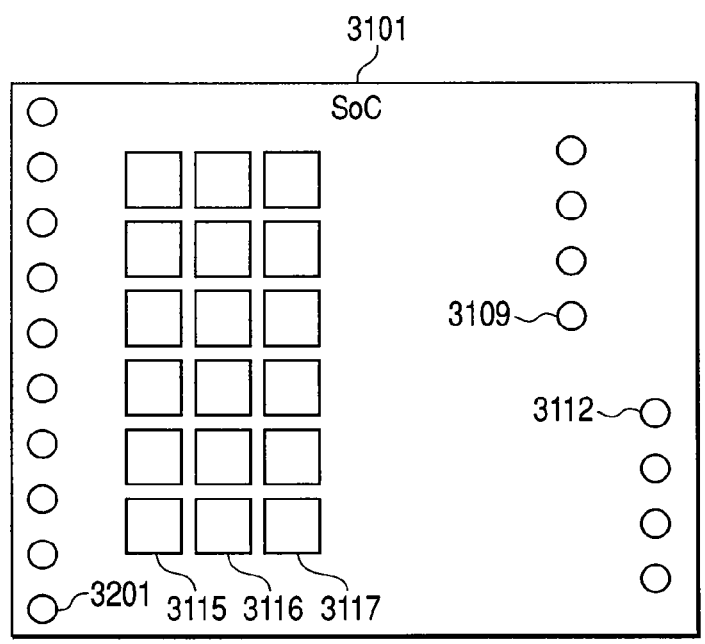
FIG. 24 is a top view of the SoC (System-on-chip) of the fourth embodiment of this invention.

FIG. 24 is a top view of the SoC3101.

The three-dimensional coupling transmit terminal group 3115, the three-dimensional coupling receive terminal groups 3116-3117, the power supply via holes 3109 and the ground via holes 3112 are formed on the upper side of the SoC3101.

The relative positions of the SoC3101 and memory A3102, and memory B3103 are described next.

The three-dimensional coupling between the SoC3101 and memory A3102, as well as between the SoC3101 and the memory B3103 are identical to the three-dimensional coupling of the first embodiment.

A SiP can therefore be formed without utilizing spacers as described above, by using the bonding wires 3106-3108 to electrically couple the SoC3101, the memory A3102, and the memory B 3103 containing the three-dimensional terminals.

A particular feature of the fourth embodiment is that the SoC3101 is positioned at the upper most layer, and the bonding pad is installed over the entire surface of the terminal side of SoC3101 so that SoC (System-on-chip) containing a larger number of terminals can be stacked.

Fifth Embodiment

In the example in the fifth embodiment, the memory A, memory B and SoC in the SiP10 of the first embodiment, are mounted in that order of closeness to the package substrate.

The physical structure of the SiP of the fifth embodiment is described next. The logical structure of the SiP of the fifth embodiment is identical to the structure of the first embodiment.

The SiP40 of the present invention is described next while referring to the drawings.

Figure 25:
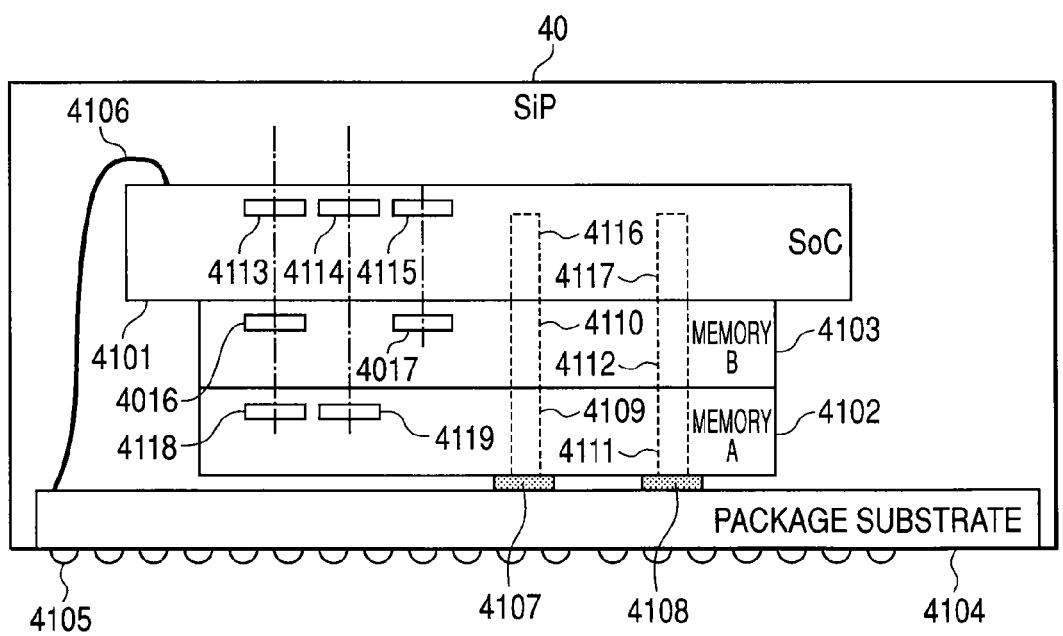
FIG. 25 is a drawing as seen from a horizontal view showing the semiconductor integrated circuit mounted in the Sip of the fifth embodiment of this invention.

FIG. 25 is a drawing showing the semiconductor integrated circuits mounted in the SiP40 as seen from a horizontal view.

The SoC4101 is positioned face-up, and the memory A1401 and memory B4103 are both stacked face-down in the SiP40.

The structure of the SiP40 is described first.

The SiP40 includes the SoC4101, memory A4102, memory B4103, package substrate 4104, external terminal 4105, bonding wire 4106, and micro-bumps 4107-4108.

The SoC4101, memory A4102, and memory B4103 correspond respectively to the SoC101, memory A102, and memory B103 in FIG. 1.

The SoC4101 contains a power supply via hole 4116, and a ground via hole 4117. The applicable power supply via hole 4116 and ground via hole 4117 are respectively formed on the lower surface of the SoC4101.

The memory A4102 of the fifth embodiment is identical to the memory A302 of the first embodiment.

The memory B4103 of the fifth embodiment is identical to the memory B303 of the first embodiment.

The package substrate 4104 is a member containing internal wiring for connecting the SoC4101, memory A4102, memory B4103 and the external terminal 4105 described later on.

The external terminal 4105 is a connection terminal for connecting the SiP40 to an external device.

The bonding wire 4106 is a bonding wire group for connecting the SoC4101 with the package substrate 4104. The bonding wire 4106 corresponds to the wiring for connecting the IO input terminal, IO output terminal of SoC101 to the respective external IO input terminal, external IO output terminal.

The micro-bump 4107 is a micro-bump group for connecting the package substrate 4104 with the power supply via hole 4116 of the SoC4101. The micro-bump 4107 corresponds to wiring between the external VDD terminal and the VDD terminal of the SoC101 in FIG. 1.

The micro-bump 4108 is a micro-bump group for connecting the package substrate 4104 with the ground via hole 4117 of the SoC4101. The micro-bump 4108 corresponds to wiring between the external VSS terminal and the VSS terminal of the SoC101 in FIG. 1.

The three-dimensional coupling transmit terminal group 4113 and the three-dimensional coupling receive terminal groups 4114-4115 respectively correspond to the three-dimensional coupling transmit terminal group 313 and the three-dimensional coupling receive terminal groups 314-315 of the first embodiment.

Figure 26:
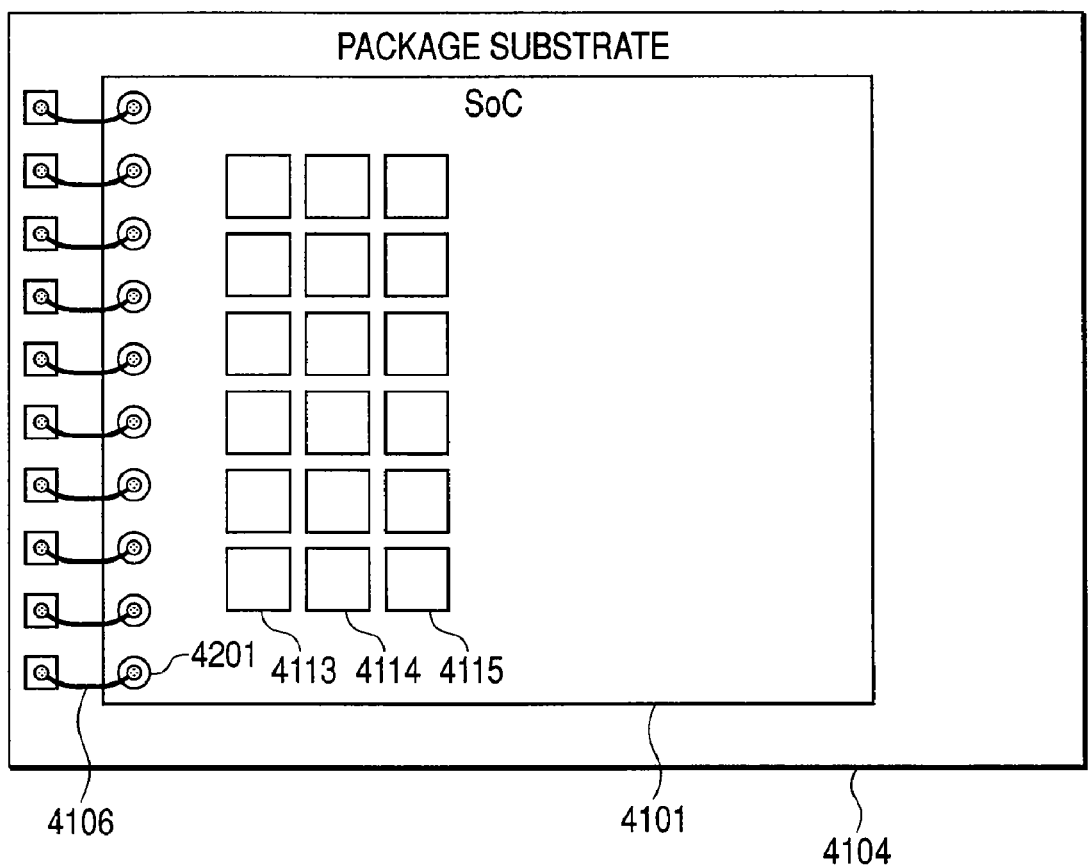
FIG. 26 is a top view of the SiP of the SiP of the fifth embodiment of this invention.

FIG. 26 is a drawing showing a top view of the SiP40

The SiP40 of the fifth embodiment employs a structure where the memory A4102 is stacked on the package substrate 4104, the memory B4103 is stacked on the memory A4102, and the SoC4101 is stacked on the memory B4103.

The memory A4102 and the memory B4103 are identical-shaped memories. The memory B4103 is mounted directly above the memory A4102 so that the memory A4102 does not appear in the upper view drawing of SiP40.

The three-dimensional coupling transmit terminal group 4113 and the three-dimensional coupling receive terminal groups 4114-4115 and bonding pad group 4201 are formed on the upper side of the SoC4101.

The relative positions of the memory A4102, the memory B4103 and the SoC4101 are described next.

The three-dimensional coupling between the memory A4102 and SoC4101, and between the SoC4101 and memory B4103 are identical to the three-dimensional coupling of the first embodiment.

The SoC4101 is stacked at a position where the power supply via hole 4116 of SoC4101 is in contact with the power supply via hole 4110 of memory B4103; and the ground via hole 4117 of SoC4101 is in contact with the ground via hole 4112 of memory B4103.

The SiP can therefore be formed without spacers as described above by utilizing the bonding wire 4106 to electrically couple the SoC4101, the memory A410 and memory B4103 containing the three-dimensional coupling terminals and via holes.

Sixth Embodiment

Figure 27:
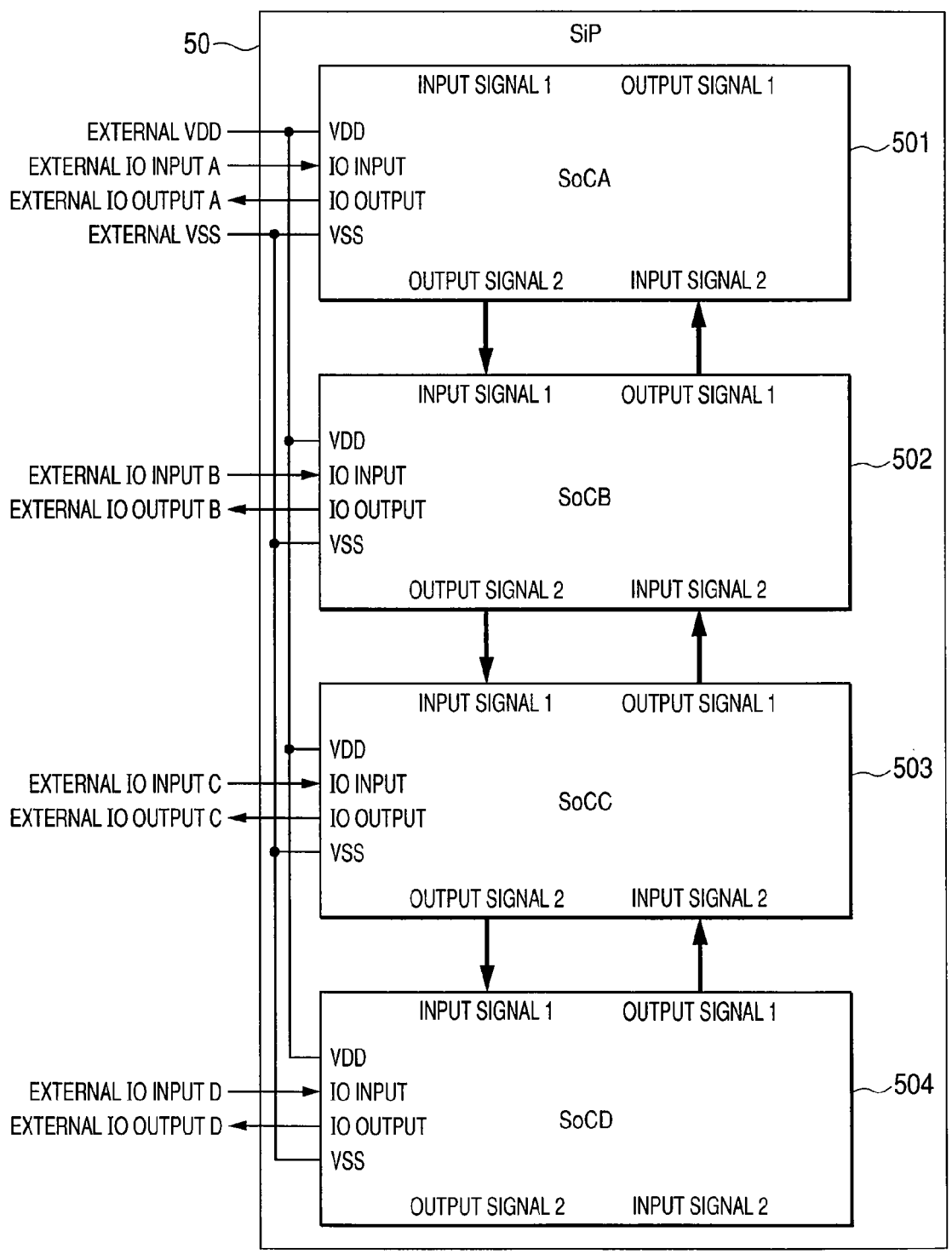
FIG. 27 is a block diagram showing the functional connection relations of the SiP of the sixth embodiment of this invention.

FIG. 27 is a block diagram showing the functional connection relations of the system-in-package (hereafter described as SiP) of the sixth embodiment.

The SiP50 contains the SoCA501, the SoCB502, the CoCC503, and the SoCD504 as well as a function to communicate outside the SiP50. The SoCA501, the SoCB502, the SoCC503, and the SoCD504 perform communications by loading and executing the program stored in the respective internal memories. The SoCA501, the SoCB502, the CoCC503, and the SoCD504 also communicate with each other and operate linked to each other.

The SoCA501 as well as the SoCB502 and SoCC503 and the SoCD504 are semiconductor integrated circuits formed on a semiconductor substrate such as single crystal silicon for forming conventional CMOS (complementary MOS transistors) or bipolar transistors by semiconductor integrated circuit technology. The power supply and ground are connected to these circuits during operation.

The SoCA501, SoCB502, SoCC503 and SoCD504 therefore each contain a power supply terminal VDD and ground terminal VSS. Moreover, the SiP50 contains an external power supply terminal and an external ground terminal for connecting the respective power supply and ground to the applicable power supply terminal and applicable ground terminal. The power supply terminals for the SoCA501, SoCB502, SoCC503 and SoCD504 each connect to the applicable external power supply terminal. Moreover, the ground terminals for the SoCA501, SoCB502, SoCC503 and SoCD504 each connect to the applicable external ground terminal.

The SoCA501, SoCB502, SoCC503 and SoCD504 each contain an IO input terminal and an IO output terminal for communicating outside the SiP50.

In order for the SoCA501, SoCB502, SoCC503 and SoCD504 to communicate outside the SiP50, the IO input terminal of SoCA501 connects to the external IO input terminal A of SiP50; the TO output terminal of SoCA501 connects to the external output terminal A of SiP50; the IO input terminal of SoCB502 connects to the external IO input terminal B of SiP50; The IO output terminal of SoCB502 connects to the external IO output terminal B of SiP50; the IO input terminal of SoCC503 connects to the external IO input terminal C of SiP50; the IO output terminal of SoCC503 connects to the external IO output terminal of SiP50; the IC input terminal of SoCD504 connects to the external IO input terminal D of SiP50; and the IC output terminal of SoCD504 connects to the external IO output terminal D of SiP50.

Moreover, the SoCA501, SoCB502, SoCC503 and SoCD504 respectively contain a comm. input1 terminal and a comm. output 1 terminal and comm. input 2 terminal and comm. output 2 terminal for communicating with each other.

A total of eight terminals (bit 7-bit 0) make up these communication input terminals and communication output terminals.

In order for the SoCA501, SoCB502, SoCC503 and SoCD504 to communicate with each other, the comm. output terminal 2 of SoCA501 connects to the comm. input terminal 1 of SoCB502; the comm. input terminal 2 of SoCA501 connects to the comm. output terminal 1 of SoCB502; the comm. output terminal 2 of SoCB502 connects to the comm. input terminal 1 of SoCC503; the comm. input terminal 2 of SoCB502 connects to the comm. output terminal 1 of SoCC503; and the comm. output terminal 2 of SoCC503 connects to the comm. input terminal 1 of SoCC504; and the comm. input terminal 2 of SoCC503 connects to the comm. output terminal 1 of SoCC504.

In the sixth embodiment, data transfer performance is improved and power consumption is reduced by utilizing three-dimensional coupling for communication between the SoCA501, and SoCB502, and SoCC503 and SoCD504 connected within the SiP50.

Figure 28:
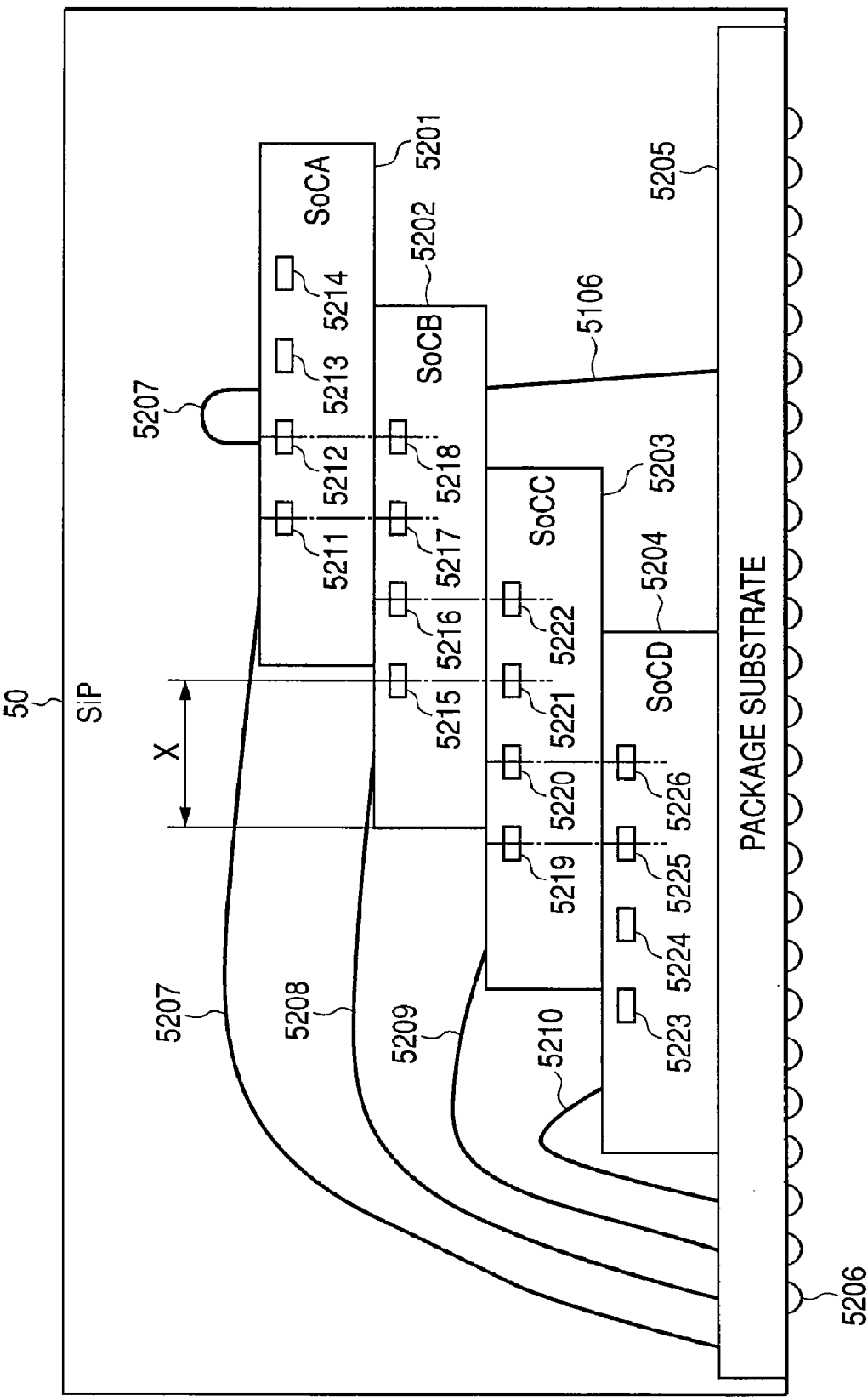
FIG. 28 is a drawing as seen from a horizontal view showing the semiconductor integrated circuits mounted in the SiP of the sixth embodiment of this invention.

FIG. 28 is a drawing showing the semiconductor integrated circuits mounted in the SiP50 as seen from a horizontal view.

In the sixth embodiment, the SoCA5201, SoCB5202, and SoCC5203 and SoCD504 are stacked face-up within the SiP50.

The structure of the SiP50 is described next.

The SiP50 includes an SoCA5201, SoCB5202, SoCC5203, and SoCD5204, package substrate 5205, external terminal 5206 and bonding wires 5207-5210.

The SoCA5201, SoCB5202, SoCC5203, and SoCD5204 correspond respectively to the SoCAS01, SoCB502, SoCC503 and SoCD504 in FIG. 27.

The package substrate 5205 is a member with internal wiring for connecting the latter described external terminal 5206 with the SoCA5201, SoCB5202, SoCC5203, and SoCD5204.

The external terminal 5206 is a connection terminal for connecting the SiP50 to an external device.

The bonding wire 5207 is a bonding wire group for connecting the package substrate 5205 to the SoCA5201. The bonding wire 5207 corresponds to wiring for connecting the VDD terminal, VSS terminal, IC input terminal, and IO output terminal of SoCA501 to the respective external VDD terminal, external VSS terminal, external IO input A terminal, and external IO output A terminal in FIG. 27.

The bonding wire 5208 is a bonding wire group for connecting the package substrate 5205 to the SoCB5202. The bonding wire 5208 corresponds to wiring for connecting the VDD terminal, VSS terminal, IO input terminal, and IO output terminal of SoCB502 in FIG. 27 to the respective external VDD terminal, external VSS terminal, external IO input B terminal, and external IO output B terminal in FIG. 27.

The bonding wire 5209 is a bonding wire group for connecting the package substrate 5205 to the SoCC5203. The bonding wire 5209 corresponds to wiring for connecting the VDD terminal, VSS terminal, IO input terminal, and IC output terminal of SoCC503 in FIG. 27 to the respective external VDD terminal, external VSS terminal, external IO input C terminal, and external IO output C terminal in FIG. 27.

The bonding wire 5210 is a bonding wire group for connecting the package substrate 5205 to the SoCD5204. The bonding wire 5210 corresponds to wiring for connecting the VDD terminal, VSS terminal, IO input terminal, and IO output terminal of SoCD504 to the respective external VDD terminal, external VSS terminal, external IO input D terminal, and external IO output D terminal in FIG. 27.

The three-dimensional coupling transmit terminal group A5211 and three-dimensional coupling receive terminal group A5212 are three-dimensional coupling terminal groups respectively equivalent to the comm. output 2 terminal and comm. input 2 terminal of SoCA501 in FIG. 27 and are utilized by the SoCA501 for communicating with the SoCB5202.

The three-dimensional coupling receive terminal group A5213 and the three-dimensional coupling transmit terminal group A5214 are a three-dimensional coupling terminal group and respectively correspond to the comm. input 1 terminal and the comm. output 2 terminal of SoCA501 in FIG. 27.

The three-dimensional coupling transmit terminal group B5215 and the three-dimensional coupling receive terminal group B5216 are the three-dimensional coupling terminal group and respectively correspond to the comm. output 2 terminal and the comm. input 2 terminal of SoCA502 in FIG. 27, and are utilized by the SoCB5202 for communicating with the SoCC5203.

The three-dimensional coupling receive terminal group B5217 and the three-dimensional coupling transmit terminal group B5218 are the three-dimensional coupling terminal group and respectively correspond to the comm. input 1 terminal and the comm. output 1 terminal of SoCB502 in FIG. 27, and are utilized by the SoCB5202 for communicating with the SoCA5201.

The three-dimensional coupling transmit terminal group C5219 and the three-dimensional coupling receive terminal group C5220 are a three-dimensional coupling terminal group and respectively correspond to the comm. output 2 terminal and the comm. input 2 terminal of the SoCC503 in FIG. 27; and are utilized by the SoCC5203 for communicating with the SoCAD204.

The three-dimensional coupling receive terminal group C5221 and the three-dimensional coupling transmit terminal group C5222 are the three-dimensional coupling terminal group and respectively correspond to the comm. input 1 terminal and the comm. output 1 terminal of SoCC503 in FIG. 27, and are utilized by the SoCC5203 for communicating with the SoCB5202.

The three-dimensional coupling transmit terminal group D5223 and the three-dimensional coupling receive terminal group D5224 are the three-dimensional coupling terminal group and respectively correspond to the comm. output 2 terminal and the comm. input 2 terminal of the SoCD504 in FIG. 27.

The three-dimensional coupling receive terminal group D5225 and the three-dimensional coupling transmit terminal group D5226 are the three-dimensional coupling terminal group and respectively correspond to the comm. input 1 terminal and the comm. output 1 terminal of SoCD504 in FIG. 27.

Figure 29:
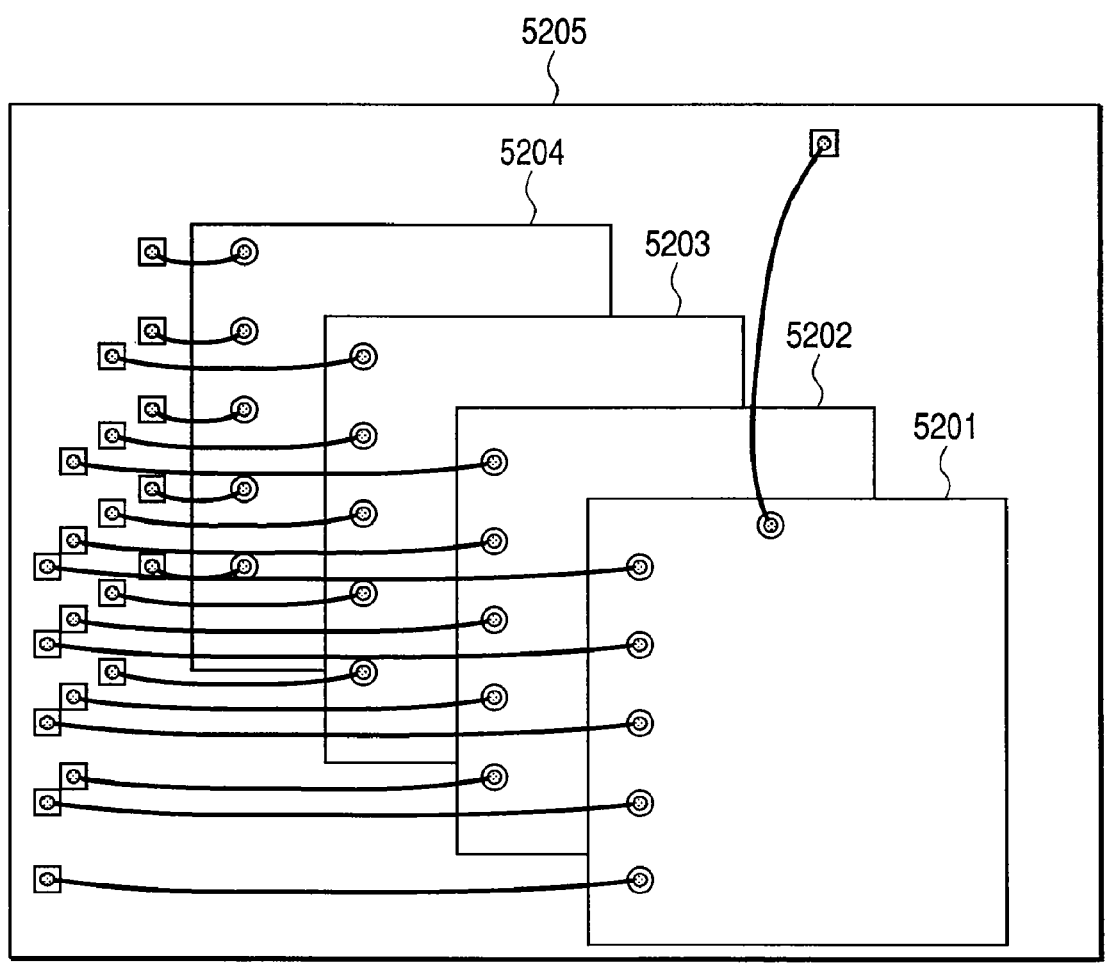
FIG. 29 is a top view showing the semiconductor integrated circuits stacked in the SiP of the sixth embodiment of this invention.

FIG. 29 is a top view of the semiconductor integrated circuits stacked in the SiP50.

The SiP50 of the sixth embodiment employs a structure where the SoCD5204 is stacked on the package substrate 5205, the SoCC5203 is stacked on the SoCD5204, the SoCB5202 is stacked on the SoCC5203, and the SoCA5201 is stacked on the SoCB5202.

Figure 30:
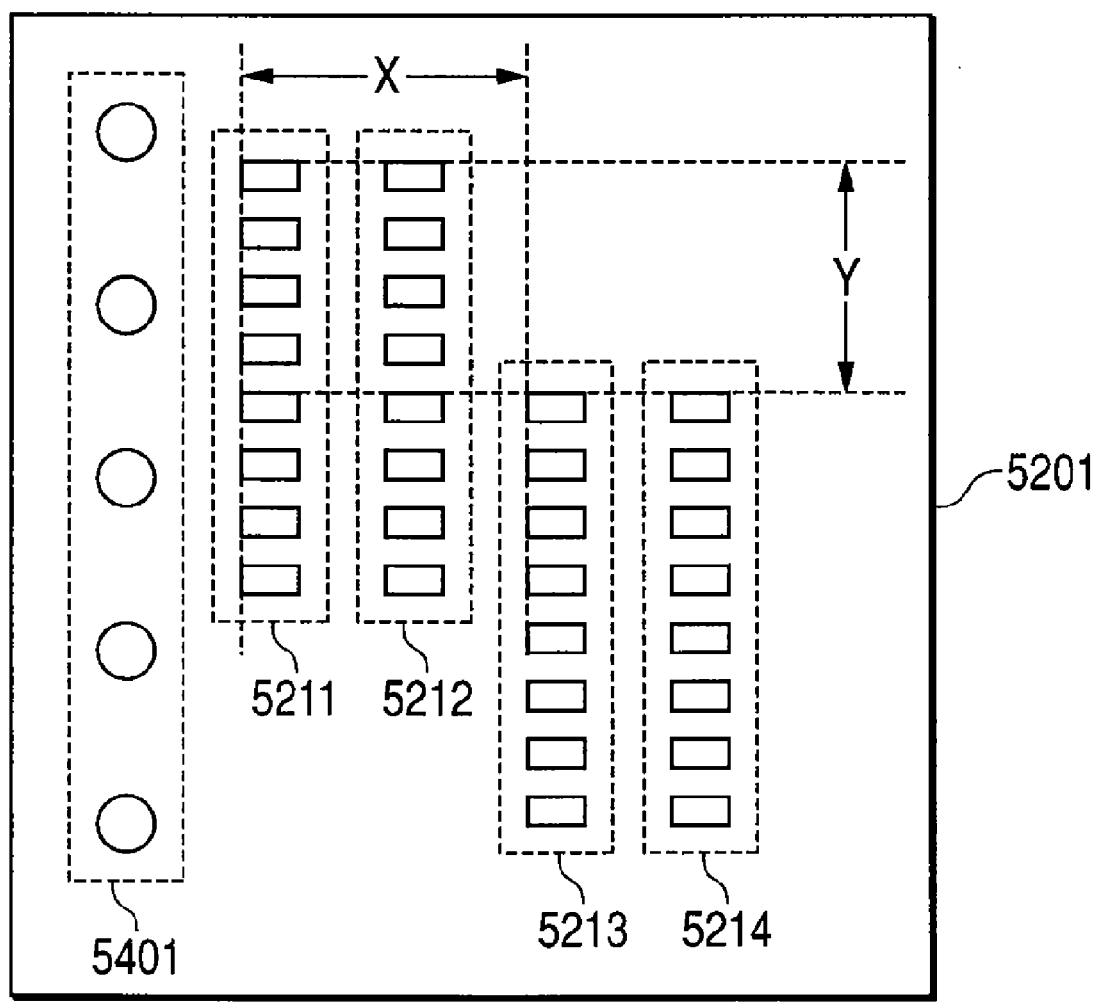
FIG. 30 is a top view of the SoCA of the sixth embodiment of this invention.

FIG. 30 is a top view of the SoCA5201 of the sixth embodiment.

A three-dimensional coupling terminal group A5211-5214 and a bonding pad group A5401 are formed on the upper side of the SoCA5201. A bonding wire 5207 is connected to the bonding pad group A5401.

The SoCB5202, the SoCC5203, SoCD5204 are SoC (System-on-chip) with the same structure as the SoCA5201. Other than the number attached to the connected bonding wires and three-dimensional coupling terminal groups, the structure is identical to the SoCA5201.

In the sixth embodiment, the X direction is toward the left and right in FIG. 28. The direction parallel to the package substrate 5205 and perpendicular to the left and right directions in FIG. 28 is called the Y direction.

Moreover, the direction to the right of the X direction is here set as the positive direction, and the Y direction toward you when viewing FIG. 28 is set as the positive direction.

The three-dimensional coupling between the SoCA5201 and the SoCB5202 is described next while referring to the drawings.

The three-dimensional coupling transmit terminals and the three-dimensional coupling receive terminals are referred to by the general name of three-dimensional coupling terminals.

Figure 31:
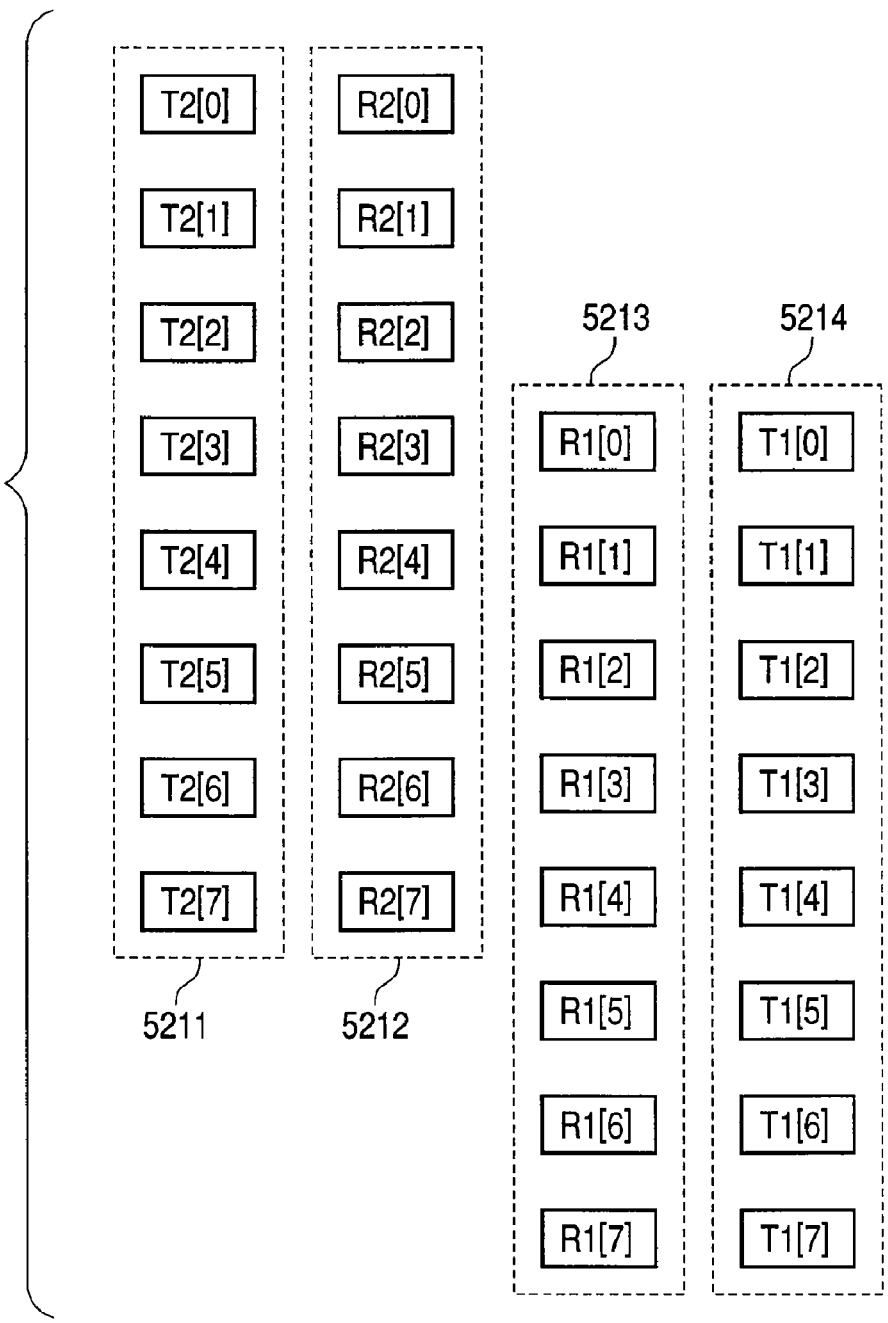
FIG. 31 is a drawing showing the terminal arrays of the three-dimensional coupling terminal groups A on the SoCA in the sixth embodiment of this invention.
Figure 32:
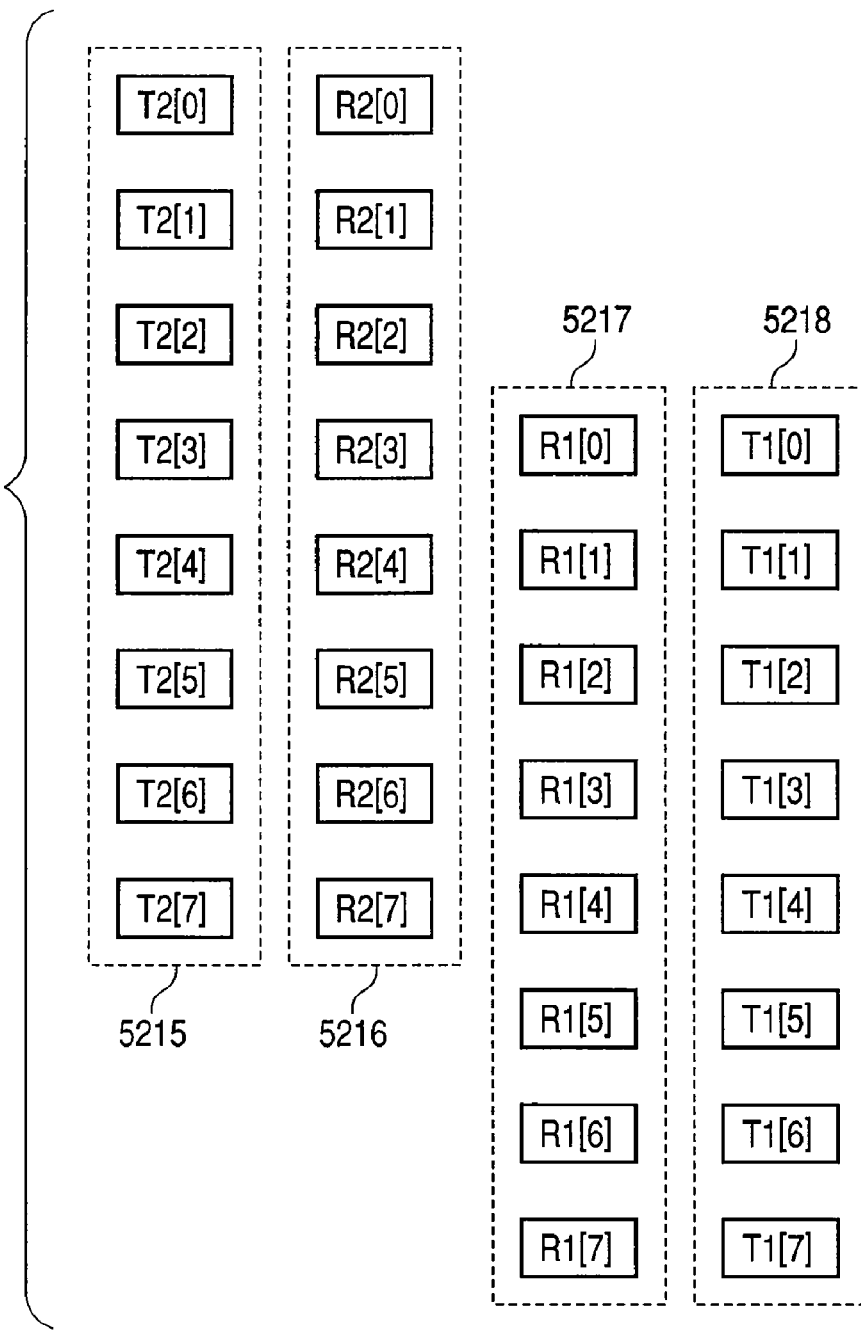
FIG. 32 is a drawing showing the terminal arrays of the three-dimensional coupling terminal groups B on the SoCB in the sixth embodiment of this invention.

FIG. 31 is a drawing showing the terminal arrays of the three-dimensional coupling terminal groups A5211-5214 on the SoCA5201. FIG. 32 is a drawing showing the terminal arrays of the three-dimensional coupling terminal groups B5215-5218 on the SoCB5202.

The three-dimensional coupling transmit terminal group A5211 contains bit 7-bit 0 of T2.

The three-dimensional coupling receive terminal group A5212 contains bit 7-bit 0 of R2.

The three-dimensional coupling receive terminal group A5213 contains bit 7-bit 0 of R1.

The three-dimensional coupling transmit terminal group A5214 contains bit 7-bit 0 of T1.

The three-dimensional coupling receive terminal group A5213 is formed at a position offset in the X direction by just an amount X, and offset in the Y direction by just an amount Y relative to the three-dimensional coupling transmit terminal group A5211.

The three-dimensional coupling transmit terminal group A5214 is formed at a position offset in the X direction by just an amount X, and offset in the Y direction by just an amount Y relative to the three-dimensional coupling receive terminal group A5212.

The three-dimensional coupling transmit terminal group B5215 contains bit 7-bit 0 of T2.

The three-dimensional coupling receive terminal group B5216 contains bit 7-bit 0 of R2.

The three-dimensional coupling receive terminal group B5217 contains bit 7-bit 0 of R1.

The three-dimensional coupling transmit terminal group B5218 contains bit 7-bit 0 of T1.

The three-dimensional coupling receive terminal group B5217 is formed at a position offset in the X direction by just an amount X, and offset in the Y direction by just an amount Y relative to the three-dimensional coupling transmit terminal group B5215.

The three-dimensional coupling transmit terminal group B5218 is formed at a position offset in the X direction by just an amount X, and offset in the Y direction by just an amount Y relative to the three-dimensional coupling receive terminal group B5216.

When the SoCA5201 is offset in the X direction, and offset in the Y direction relative to the SoCB5202 and is stacked above the SoCB5202, then the bits from bit 7 to bit 0 of T2 on SoCA5201 are respectively positioned directly above the bits from bit 7 to bit 0 of R1 on the SoCB5202. Transmission is in this way implemented from the SoCB5201 to the SoCA5202.

When the SoCA5201 is offset in the same way in the X direction by just an amount X, offset in the Y direction by just an amount Y relative to the SoCB5202 and is stacked above the SocB5202, then the bits from bit 7-bit 0 of R2 on SoCA5201 are respectively positioned directly above the bits from bit 7-bit 0 of T1 on the SoCB5202, so that transmission is in this way implemented from SoCB5202 to SoCA5201.

The three-dimensional coupling between the SoCB5202 and the SoCC5203 are described next while referring to the drawing.

Figure 33:
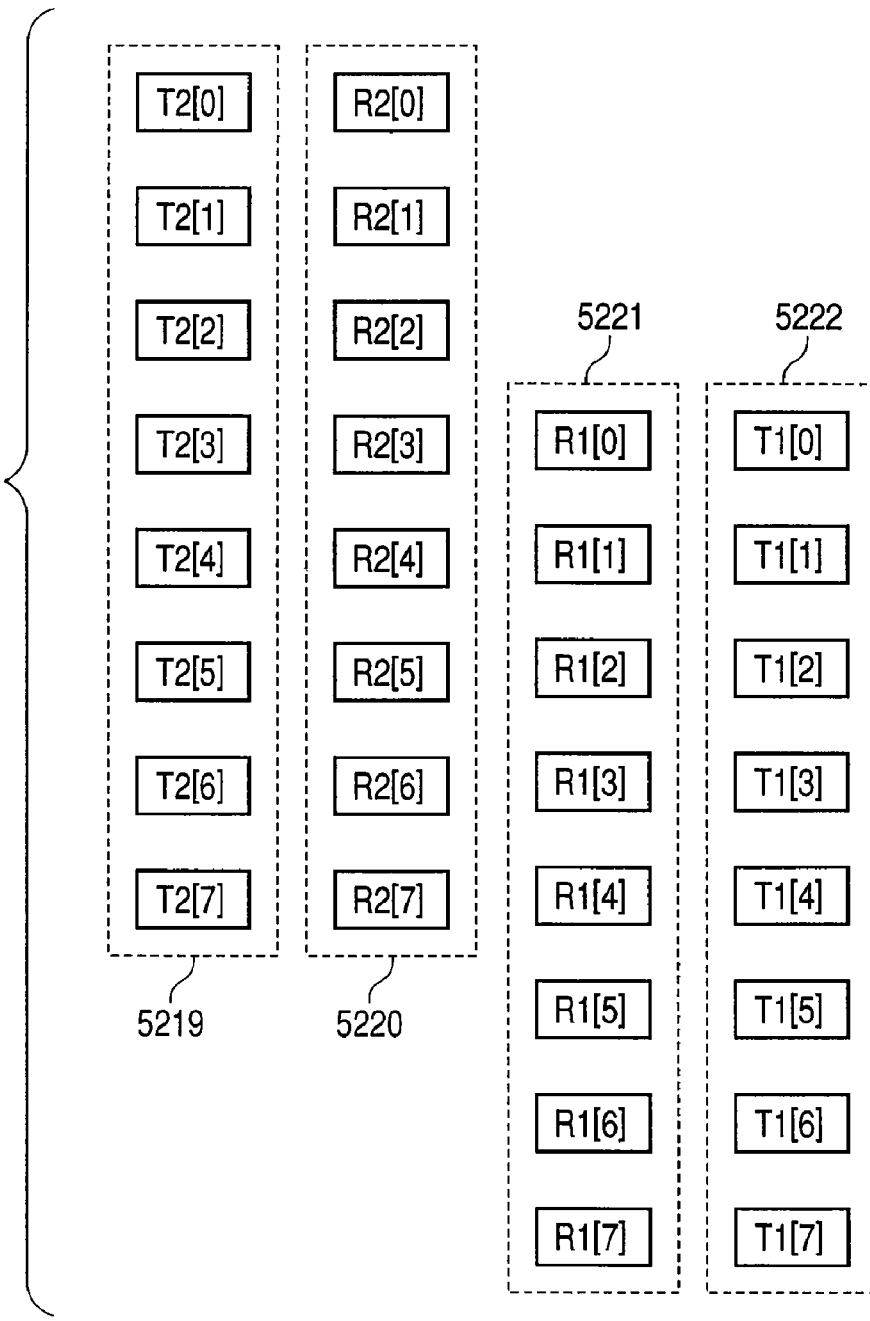
FIG. 33 is a drawing showing the terminal arrays of the three-dimensional coupling terminal groups C on SoCC in the sixth embodiment of this invention.

FIG. 33 is a drawing showing the terminal arrays of the three-dimensional coupling terminal groups C5219-5222 on SoCC5203.

The three-dimensional coupling transmit terminal group C5219 contains bit 7-bit 0 of T2.

The three-dimensional coupling receive terminal group C5220 contains bit 7-bit 0 of R2.

The three-dimensional coupling receive terminal group C5221 contains bit 7-bit 0 of R1.

The three-dimensional coupling transmit terminal group C5222 contains bit 7-bit 0 of T1.

The three-dimensional coupling receive terminal group C5221 is formed at a position offset in the X direction just be amount X, and offset in the Y direction just by an amount Y relative to the three-dimensional coupling transmit terminal group C5219.

The three-dimensional coupling transmit terminal group C5222 is formed at a position offset in the X direction just by amount X, and offset in the Y direction just by an amount Y relative to the three-dimensional coupling receive terminal group C5220.

When the SoCB5202 is offset in the X direction just be amount X, and offset in the Y direction just by an amount Y relative to the SoCC5203 and stacked above the SoCC5203, bits from bit 7 to bit 0 of T2 on SoCB5202 are respectively positioned directly above the bits from bit 7 to bit 0 of R1 on the SoCC5203. Transmission is in this way carried out from the SoCB5202 to the SoCC5203.

When the SoCB5202 is offset in the same way in the X direction just by an amount X and offset in the Y direction just by an amount Y relative to the SoCC5203 and stacked above it, then the bits from bit 7 to bit 0 of R2 on the CB5202 are positioned directly above the bits from bit 7 to bit 0 of T1 on the SoCC5203. Transmissions are in this way made from the SoCC5203 to the SoCB5202.

The three-dimensional coupling between the SoCC5203 and the SoCD5204 is described next while referring to the drawing.

Figure 34:
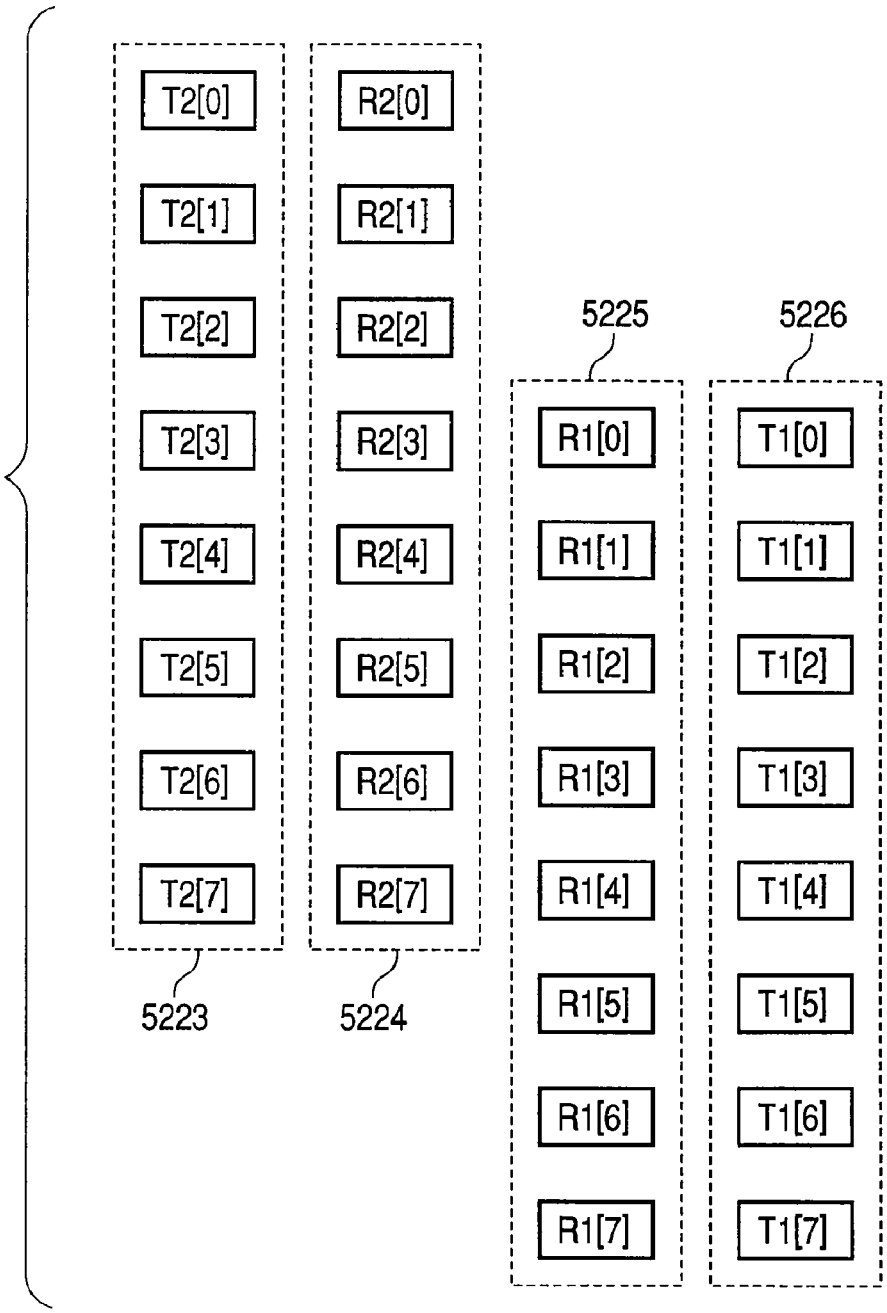
FIG. 34 is a drawing showing the terminal arrays of the three-dimensional coupling terminal groups D on SoCD in the sixth embodiment of this invention.

FIG. 34 is a drawing showing the terminal arrays of the three-dimensional coupling terminal groups D5223-5226 on SoCD5204.

The three-dimensional coupling transmit terminal group D5223 contains bit 7-bit 0 of T2.

The three-dimensional coupling receive terminal group D5224 contains bit 7-bit 0 of R2.

The three-dimensional coupling receive terminal group D5225 contains bit 7-bit 0 of R1.

The three-dimensional coupling transmit terminal group D5226 contains bit 7-bit 0 of T1.

The three-dimensional coupling receive terminal group D5225 is formed at a position offset in the X direction just by an amount X and offset in the Y direction just by an amount Y relative to the three-dimensional coupling transmit terminal group D5223.

The three-dimensional coupling transmit terminal group D5226 is formed at a position offset in the X direction just by an amount X and offset in the Y direction just by an amount Y relative to the three-dimensional coupling receive terminal group D5224.

When the SoCC52C3 is offset in the X direction just by an amount X and offset in the Y direction just by an amount Y relative to the SoCD5204 and stacked over the SoCD5204, bits from bit 7 to bit 0 of T2 on SoCC5203 are respectively positioned directly over the bits from bit 7 to bit 0 of R1 on the SoCD5204. Transmission is in this way carried out from the SoCC5203 to the SoCD5204.

In the same way, when the SoCC5203 is offset and stacked in the X direction just by an amount X and n the Y direction just by an amount Y relative to the SoCD5204, the bits from bit 7 to bit 0 of T2 on SoCC5203 are respectively positioned directly over the bits from bit 7 to bit 0 of T1 of SoCD5204. Transmission is in this way carried out from the SoCD5204 to the SoCC5203.

The sixth embodiment of this invention can stack multiple chips having the same design by positioning the chips separate from each other while aligned to match the offset when stacking the three-dimensional coupling receive terminals, and three-dimensional coupling transmit terminals paired with the applicable terminals. The chip types can in this way be held to a minimum and chip development costs and be kept low.

In particular by offsetting the chips in the two X and Y directions during stacking, even chips other than the topmost stacked chip can be arranged so that bonding pads are formed across two sides of the chip.

The sixth embodiment was described using an example where integrated circuits with the identical functions and structure were stacked. However, the shape (contour) of the chips for stacking need not be a problem if the three-dimensional coupling receive terminals, and three-dimensional coupling transmit terminals paired with the applicable terminals are aligned to match the offset of the semiconductor integrated circuits during the stacking.

Many types of semiconductor integrated circuit types using three-dimensional couplings can therefore be stacked if the offsets for the three-dimensional coupling receive terminals, and three-dimensional coupling transmit terminals paired with the applicable terminals are standardized.

The invention rendered by the present inventors was described in detail based on the embodiments. Needless to say however, this invention is no limited by these embodiments and all manner of changes and adaptations not departing from the spirit and scope of this invention are allowable.

What is claimed is:

1. A semiconductor device comprising:
   a first semiconductor integrated circuit including a first three-dimensional coupling circuit;
   a second semiconductor integrated circuit including a first feed-through electrode and a second three-dimensional coupling circuit for inductively coupling to the first three-dimensional coupling circuit; and
   a third semiconductor integrated circuit including a second feed-through electrode connected to the first feed-through electrode, and a third three-dimensional coupling circuit inductively coupling to the first three-dimensional coupling circuit,
   wherein the first, second, and third semiconductor integrated circuits are stacked,
   wherein the second semiconductor integrated circuit includes a first and a second three-dimensional receive circuit, and a first and a second three-dimensional transmit circuit, and is stacked between the first semiconductor integrated circuit and the third semiconductor integrated circuit,
   wherein data from the first semiconductor integrated circuit received by way of the first three-dimensional receive circuit is sent by way of the second three-dimensional transmit circuit to the third semiconductor integrated circuit,
   wherein data from the third semiconductor integrated circuit received by way of the second three-dimensional receive circuit is sent by way of the first three-dimensional transmit circuit to the first semiconductor integrated circuit,
   wherein the first and the second three-dimensional receive circuits, and the first and the second three-dimensional transmit circuits in the second semiconductor integrated circuit are positioned in the order of: the first three-dimensional transmit circuit, the first three-dimensional receive circuit, the second three-dimensional receive circuit, and the second three-dimensional transmit circuit,
   wherein the second semiconductor integrated circuit and the third semiconductor integrated circuit have an identical construction and functions, and
   wherein the third semiconductor integrated circuit is stacked on the second semiconductor integrated circuit with an offset such that the first three-dimensional transmit circuit of the third semiconductor integrated circuit is aligned with the second three-dimensional receive circuit of the second semiconductor integrated circuit.

2. The semiconductor device according to claim 1, wherein the first feed-through electrode is the power supply terminal and ground terminal of the second semiconductor integrated circuit.

3. The semiconductor device according to claim 1, wherein the second semiconductor integrated circuit connects by way of the third semiconductor integrated circuit to an external power supply terminal and an external ground terminal by wire bonding.

4. The semiconductor device according to claim 1, wherein the first semiconductor integrated circuit sends an address and write data from a transmit terminal of the first three-dimensional coupling circuit; and wherein the second semiconductor integrated circuit and third semiconductor integrated circuit receive the address and the write data sent from the transmit terminal of the first three-dimensional coupling circuit.

5. The semiconductor device according to claim 1,
wherein the second semiconductor integrated circuit sends read data from the transmit terminal of the second three-dimensional coupling circuit;
wherein the third semiconductor integrated circuit sends read data from the transmit terminal of the third three-dimensional coupling circuit; and
wherein the first semiconductor integrated circuit receives read data sent from the transmit terminal of the second three-dimensional coupling circuit on the receive terminal of the first three-dimensional coupling circuit and, read data sent from the transmit terminal of the third three-dimensional coupling circuit is received at the receive terminal of the first three-dimensional coupling circuit.

6. The semiconductor device according to claim 1,
wherein the first semiconductor integrated circuit has an identical construction and functions as the second and third semiconductor integrated circuits, and
wherein the second semiconductor integrated circuit is stacked on the first semiconductor integrated circuit with an offset such that the first three-dimensional transmit circuit of the second semiconductor integrated circuit is aligned with the second three-dimensional receive circuit of the first semiconductor integrated circuit.

7. A semiconductor device comprising:
a first semiconductor integrated circuit including a first three-dimensional coupling circuit, and a first feed-through electrode;
a second semiconductor integrated circuit including a second three-dimensional coupling circuit inductively coupled to the first three-dimensional coupling circuit, and a second feed-through electrode connected to the first feed-through electrode; and
a third semiconductor integrated circuit including a third three-dimensional coupling circuit inductively coupled to the first three-dimensional coupling circuit, and a third feed-through electrode connected to the second feed-through electrode,
wherein the first, second, and third semiconductor integrated circuits are stacked,
wherein the second semiconductor integrated circuit includes a first and a second three-dimensional receive circuit, and a first and a second three-dimensional transmit circuit, and is stacked between the first semiconductor integrated circuit and the third semiconductor integrated circuit,
wherein data from the first semiconductor integrated circuit received by way of the first three-dimensional receive circuit is sent by way of the second three-dimensional transmit circuit to the third semiconductor integrated circuit,
wherein data from the third semiconductor integrated circuit received by way of the second three-dimensional receive circuit is sent by way of the first three-dimensional transmit circuit to the first semiconductor integrated circuit,
wherein the first and the second three-dimensional receive circuits, and the first and the second three-dimensional transmit circuits in the second semiconductor integrated circuit are positioned in the order of: the first three-dimensional transmit circuit, the first three-dimensional receive circuit, the second three-dimensional receive circuit, and the second three-dimensional transmit circuit,
wherein the second semiconductor integrated circuit and the third semiconductor integrated circuit have an identical construction and functions, and
wherein the third semiconductor integrated circuit is stacked on the second semiconductor integrated circuit with an offset such that the first three-dimensional transmit circuit of the third semiconductor integrated circuit is aligned with the second three-dimensional receive circuit of the second semiconductor integrated circuit.

8. The semiconductor device according to claim 7,
wherein the first feed-through electrode is a power supply terminal and ground terminal of the first semiconductor integrated circuit;
wherein the second feed-through electrode is a power supply and ground terminal of the second semiconductor integrated circuit;
wherein the second semiconductor integrated circuit connects to the external power supply terminal and ground terminal by way of the first semiconductor integrated circuit; and
wherein the third semiconductor integrated circuit is connected by way of the second semiconductor integrated circuit and the first semiconductor integrated circuit to the external power supply terminal and ground terminal.

9. The semiconductor device according to claim 7,
wherein the first semiconductor integrated circuit has an identical construction and functions as the second and third semiconductor integrated circuits, and
wherein the second semiconductor integrated circuit is stacked on the first semiconductor integrated circuit with an offset such that the first three-dimensional transmit circuit of the second semiconductor integrated circuit is aligned with the second three-dimensional receive circuit of the first semiconductor integrated circuit.

* * * * *